US008908881B2

(12) United States Patent
Sato

(10) Patent No.: US 8,908,881 B2
(45) Date of Patent: Dec. 9, 2014

(54) SOUND SIGNAL PROCESSING DEVICE

(75) Inventor: Kenji Sato, Hamamatsu (JP)

(73) Assignee: Roland Corporation, Hamamatsu (JP)

( * ) Notice: Subject to any disclaimer, the term of this patent is extended or adjusted under 35 U.S.C. 154(b) by 684 days.

(21) Appl. No.: 13/208,294

(22) Filed: Aug. 11, 2011

(65) Prior Publication Data

US 2012/0082323 A1 Apr. 5, 2012

(30) Foreign Application Priority Data

Sep. 30, 2010 (JP) ................................ 2010-221216

(51) Int. Cl.

| | |
|---|---|
| ***G10L 21/0208*** | (2013.01) |
| ***H04N 11/00*** | (2006.01) |
| ***H03G 1/02*** | (2006.01) |
| ***G10H 1/08*** | (2006.01) |
| ***G10L 21/0272*** | (2013.01) |
| ***G10H 1/00*** | (2006.01) |
| *G10L 21/028* | (2013.01) |
| *G10L 21/0308* | (2013.01) |

(52) U.S. Cl.

CPC .......... *G10L 21/0272* (2013.01); *G10H 1/0091* (2013.01); *G10L 21/028* (2013.01); *G10L 21/0308* (2013.01); *G10L 2021/02082* (2013.01); *G10L 2021/02087* (2013.01); *G10H 2210/281* (2013.01); *G10H 2250/235* (2013.01)

USPC ............ 381/94.3; 381/56; 381/104; 381/105; 381/106; 381/107; 84/625

(58) Field of Classification Search

USPC .......... 381/56, 58, 77, 94.3, 104–107; 84/625

See application file for complete search history.

(56) References Cited

U.S. PATENT DOCUMENTS 5,426,702 A 6/1995 Aarts
6,094,490 A * 7/2000 Kim ............................ 381/94.5

(Continued)

FOREIGN PATENT DOCUMENTS

EP 1 640 973 3/2006
JP H04-296200 A 10/1992

(Continued)

OTHER PUBLICATIONS

Miwa, A., et al. "Sound source separation for stereo music signal recorded in an active environment", IEEE International Conference on Multimedia and Expo, ICME 2001, Advanced Distributed Learning, Aug. 22, 2001, pp. 1012-1015, XP010661961.

(Continued)

*Primary Examiner* — Duc Nguyen
*Assistant Examiner* — George Monikang
(74) *Attorney, Agent, or Firm* — Foley & Lardner LLP

(57) ABSTRACT

A sound signal processing device that is capable of suitably extracting main sound from mixed sound in which unnecessary sound (for example, leakage sound and reverberant sound) is mixed with the main sound. More specifically, a mixed sound signal in the time domain including first sound and second sound, and a target sound signal in the time domain including sound corresponding to at least the second sound, which have temporal relation in their entirety or in part, are each divided into a plurality of frequency bands. A level ratio between the two signals is calculated at each frequency. Based on the level ratio, a signal of the first sound that is included in the mixed sound signal is extracted.

10 Claims, 14 Drawing Sheets

(56) References Cited

U.S. PATENT DOCUMENTS

| | | | |
|---|---|---|---|
| 7,162,045 B1 | 1/2007 | Fujii | |
| 2006/0050898 A1 | 3/2006 | Yamada et al. | |
| 2006/0067541 A1 | 3/2006 | Yamada et al. | |
| 2007/0110258 A1 | 5/2007 | Kimijima | |
| 2008/0170704 A1* | 7/2008 | Kemmochi et al. | 381/2 |
| 2009/0161879 A1* | 6/2009 | Yanagawa | 381/17 |
| 2010/0111329 A1 | 5/2010 | Namba et al. | |
| 2010/0142729 A1* | 6/2010 | Noguchi | 381/107 |

FOREIGN PATENT DOCUMENTS

| | | |
|---|---|---|
| JP | H06-062499 A | 3/1994 |
| JP | H06-205500 A | 7/1994 |
| JP | H07-154306 A | 6/1995 |
| JP | 2000-134700 | 5/2000 |
| JP | 2001-069597 A | 3/2001 |
| JP | 2002-078100 A | 3/2002 |
| JP | 2002-247699 A | 8/2002 |
| JP | 2005-173055 A | 6/2005 |
| JP | 2006-080708 | 3/2006 |
| JP | 2006-100869 A | 4/2006 |
| JP | 2007-135046 A | 5/2007 |
| JP | 2008-072600 A | 3/2008 |
| JP | 2009-010992 A | 1/2009 |
| JP | 2009-188971 A | 8/2009 |
| JP | 2009-244567 A | 10/2009 |
| JP | 2009-277054 A | 12/2009 |
| JP | 2010-112996 | 5/2010 |
| WO | WO-2005/057551 A1 | 6/2005 |

OTHER PUBLICATIONS

Extended European Search Report dated Sep. 21, 2012, from related EP Patent Application No. 11 179 183.6, six pages.

English Machine Translation for Japanese publication No. 2002-078100.

English Machine Translation for Japanese publication No. 2002-247699.

English Machine Translation for Japanese publication No. 2005-173055.

English Machine Translation for Japanese publication No. 2008-072600.

English Machine Translation for Japanese publication No. 2009-010992.

English Machine Translation for Japanese publication No. 2009-188971.

English Machine Translation for Japanese publication No. 2009-244567.

English Machine Translation for Japanese publication No. H06-062499.

English Machine Translation for Japanese publication No. H07-154306.

As-filed Response dated Apr. 16, 2013, to extended European Search Report dated Sep. 21, 2012, from related EP Patent Application No. 11 179 183.6, six pages.

EPO Communication pursuant to Article 94(3) EPC dated Jul. 16, 2013, from related EP Patent Application No. 11 179 183.6, three pages.

Japanese Official Action, with English translation, dated Apr. 28, 2014, from related JP Patent Application No. 2010-221216, five pages.

* cited by examiner (a)

(b)

(a)

(b)

(a)

(b)

E: Amount of Attenuation

SOUND SIGNAL PROCESSING DEVICE

CROSS-REFERENCE TO RELATED PATENT APPLICATIONS

Japan Priority Application 2010-221216, filed Sep. 30, 2010, including the specification, drawings, claims and abstract, is incorporated herein by reference in its entirety.

FIELD OF THE INVENTION

The present invention relates to a sound signal processing device and, in particular embodiments, to a sound signal processing device which can suitably extract main sound from mixed sound in which unnecessary sounds are mixed with the main sound.

BACKGROUND

Performance sound of multiple musical instruments playing one musical composition may be recorded for each of the musical instruments independently in a live performance or the like. In this case, the recorded sound of each of the musical instruments is composed of mixed sound in which performance sound of each of the musical instruments is mixed with performance sound of the other musical instruments called "leakage sound." When the recorded sound of each of the musical instruments is processed (for example, delayed), the presence of leakage sound may become problem, and it is desired to remove such leakage sound from the recorded sound.

Also, sound recorded with a microphone generally includes original sound and its reverberation components (reverberant sound). Several technical methods have been proposed to attempt to remove reverberant sound from mixed sound in which original sound is mixed with the reverberant sound. For example, according to one of such methods, a waveform of pseudo reverberant sound corresponding to reverberant sound is generated, and the waveform of the pseudo reverberant sound is deducted from the original mixed sound on the time axis (for example, see Japanese Laid-open Patent Application HEI 07-154306). According to another method, a phase-inverted wave of reverberant sound is generated from mixed sound, and is emanated from an auxiliary speaker to be mixed with the mixed sound in a real field, thereby cancelling out the reverberant sound (see, for example, Japanese Laid-open Patent Application HEI 06-062499).

However, with methods as described in Japanese Laid-open Patent Application HEI 07-154306, the sound quality of the reproduced sound can be poor, unless waveforms of the pseudo reverberant sound are accurately generated. With methods as described in Japanese Laid-open Patent Application HEI 06-062499, audience positions where reverberant sound can be removed are limited.

SUMMARY OF THE DISCLOSURE

The present applicant proposed a technology to extract, from signals of mixed sounds in which multiple musical sounds are mixed together, the musical sounds at plural localization positions, based on levels of the signals in the frequency domain (for example, Japanese Patent Application 2009-277054 (unpublished)).

Embodiments of the present invention relate to a sound signal processing device that is capable of suitably extracting main sound from mixed sound in which unnecessary sound (for example, leakage sound and reverberant sound) is mixed with the main sound.

With regard to a sound signal processing device according to an embodiment of the present invention, a mixed sound signal is a signal in the time domain of mixed sound including first sound and second sound. A target sound signal is a signal in the time domain of sound including sound corresponding to at least the second sound. These two signals have temporal relation in their entirety or in part. Each of the two signals is divided into a plurality of frequency bands; and a level ratio between the two signals is calculated at each frequency. The level ratio serves as an index to represent the magnitude of a difference between the mixed sound signal and the target sound signal. Based on the index, a signal of the first sound that is included in the mixed sound signal but not included in the target sound signal can be distinguished from a signal of the second sound. A range of level ratios indicative of the first sound is pre-set for each of the frequency bands. Then, a judging device judges as to whether or not the level ratio calculated by the level ratio calculating device is within the set range. Further, from among signals corresponding to the mixed sound signal, a signal in a frequency band which is judged by the judging device to be in the range is extracted by an extracting device. In this manner, the signal of the first sound included in the mixed sound signal can be extracted. Accordingly, from the mixed sound in which unnecessary sound as the second sound is mixed with the main sound as the first sound, the main sound being the first sound can be extracted. The unnecessary sound may be, for example, leakage sound, sound migrated in due to deterioration of a recording tape, reverberant sound, and the like.

The first sound is extracted from the mixed sound (in other words, the second sound is excluded), while focusing on their frequency characteristics and level ratios. In other words, because it need not accompany deduction of a pseudo-generated waveform on the time axis, the first sound can be readily extracted with good sound quality. Further, because it need not accompany cancellation with inverted-phase waves in the sound image space, the first sound can be extracted with good sound quality without limiting its audition positions. Therefore, in a sound signal processing device according to an embodiment of the present invention, the main sound can be suitably extracted from a mixed sound in which unnecessary sound is mixed with the main sound.

In a further example of a sound signal processing device according to the above embodiment of the present invention, a time difference that is generated based on a difference in sound generation timing between the first sound and the second sound included in the mixed sound is adjusted by an adjusting device. More specifically, the signal inputted from the first input device (the mixed sound signal) or the signal inputted from the second input device (the target sound signal) is adjusted by delaying it on the time axis by an adjustment amount according to the time difference. The time difference is a time difference between the signal of the second sound in the mixed sound signal and the signal of the second sound in the target sound signal. Therefore, by the adjustment performed by the adjusting device, the signal of the second sound in the mixed sound signal and the signal of the second sound in the target sound signal can be matched with each other on the time axis.

A "time difference" may be generated, for example, based on a difference between the characteristic of the sound field space between the first output source that outputs the first sound and the sound collecting device, and the characteristic of the sound field space between the second output source that outputs the second sound and the sound collecting device. Also, a "time difference" may occur, for example, when a cassette tape that records sounds is deteriorated, and signals of second sound that are time-sequentially different from first signals of first sound recorded at a certain time are transferred onto the signals of the first sound in a portion of overlapped segments of the wound tape. The signals of the second sound not only include signals of sound that are recorded later in time, but also include signals of sound that are recorded earlier in time. Also, a "time difference" includes the case where no time difference exists (in other words, a time difference of zero). Further, an "adjustment amount according to a time difference" may include no adjustment (in other words, an adjustment amount of zero).

Therefore, in a sound signal processing device according to the above example embodiment of the present invention, the main sound can be suitably extracted from mixed sound in which unnecessary sound (for example, leakage sound, transferred noise due to deterioration of a recording tape, and the like) is mixed in main sound.

In a further example of a sound signal processing device according to the above example embodiment of the present invention, a second extracting device extracts a signal, from signals corresponding to the mixed sound signal among the adjusted signal or the original signal in a frequency band, with the level ratio that is judged to be outside of the pre-set range. Therefore, signals of sound corresponding to the second sound included in the mixed sound can be extracted and outputted. By extracting and outputting signals of sound corresponding to the second sound included in the mixed sound, the user can hear which sound is removed from the mixed sound. By this, information for properly extracting the first sound can be provided.

In a further example of a sound signal processing device according to any of the above example embodiments of the present invention, first sound recorded in a predetermined track can be extracted from among multitrack data. From multitrack data of performance sounds of a plurality of musical instruments performing one musical composition, which may be recorded in a live concert or the like independently from one musical instrument to another, signals of sound recorded in a track that records sound of a target musical instrument or human voice are inputted in a first input device. Further, signals of sounds recorded in other tracks that record sounds other than the sound of the target musical instrument or human voice included in the sounds recorded in the specified track are inputted in the second input device. In this manner, the sound of the target musical instrument or human voice from which leakage sound is removed can be extracted.

In a further example of a sound signal processing device according to any of the above example embodiments of the present invention, an adjusted signal is generated based on a delay time as the adjustment amount according to the position of each of the second output sources and the number of second output sources. Therefore, the signal of the second sound in the mixed sound signal and the signal of the second sound in the target sound signal can be matched with each other with high accuracy, and the first sound can be extracted with good sound quality.

In a further example of a sound signal processing device, an input device inputs, as the mixed sound signal, a signal in the time domain of mixed sound including first sound outputted from a predetermined output source and second sound generated based on the first sound in a sound field space, where the first and second sounds are collected and obtained by a single sound collecting device. A pseudo signal generation device delays the signal of the mixed sound on the time axis according to an adjustment amount determined according to a time difference between a time at which the first sound is collected by a sound collecting device and a time at which the second sound is collected by the same sound collecting device. By this, a signal of the second sound as the target sound signal is pseudo-generated from the signal of the mixed sound.

Therefore, according to the above example embodiment of a sound signal processing device, the main sound (for example, original sound) can be suitably extracted from mixed sound in which unnecessary sound (for example, reverberant sound or the like) is mixed with the main sound.

Also, according to the above example embodiment of a sound signal processing device, it is possible to extract the original sound from the mixed sound which is inputted through the input device and includes the first sound as the original sound and reverberant sound (the second sound).

In a further example of a sound signal processing device according to the above example embodiment of the present invention, delay times generated according to the reverberation characteristic in a sound field space are used as the adjustment amount, each of which is a delay time from the time when the first sound is collected by the sound collection device to the time when reverberant sound generated based on the first sound is collected by the sound collection device. Then, based on the delay times as the adjustment amount, and the number set for reflection positions that reflect the first sound in the sound field space, a signal of early reflection is generated as a pseudo signal of the second sound. Therefore, signals of early reflection can be accurately simulated, such that the original sound (the first sound) can be extracted with good sound quality.

In a further example of a sound signal processing device according to certain example embodiments of the present invention described above, a present level of the pseudo signal of the second sound is compared with a previous level thereof. When the current level is smaller than a level obtained by multiplying the previous level with a predetermined attenuation coefficient, a level correction device corrects the level of the pseudo signal of the second sound to be used in the level ratio calculation device to the level obtained by multiplying the previous level with the predetermined attenuation coefficient. Therefore, rapid attenuation of the level of the pseudo signal of the second sound can be dulled. In other words, rapid changes in the level ratios calculated by the level ratio calculation device can be suppressed. As a result, reflected sounds with a relatively lower level that follow the arrival of reflected sounds that occur from sounds with great volume level can be captured.

In a further example of a sound signal processing device according to certain example embodiments of the present invention described above, level ratios calculated by the level ratio calculation device are corrected such that, the smaller the level of the mixed sound signal, the smaller the ratio of the mixed sound signal with respect to the level of the pseudo signal of the second sound. Therefore, it is possible to make signals of mixed sound with lower levels to be readily judged as the second sound. As a result, late reverberant sound can be captured.

BRIEF DESCRIPTION OF THE DRAWINGS

FIG. 4 (*b*) is a schematic graph showing impulse responses to be convoluted with an input signal by the delay section shown in FIG. 4 (*a*).

FIG. 9 (*b*) is a schematic diagram showing impulse responses to be convoluted with an input signal by the Lch early reflection component generation section shown in FIG. 9 (*a*).

DETAILED DESCRIPTION

Figure 1:
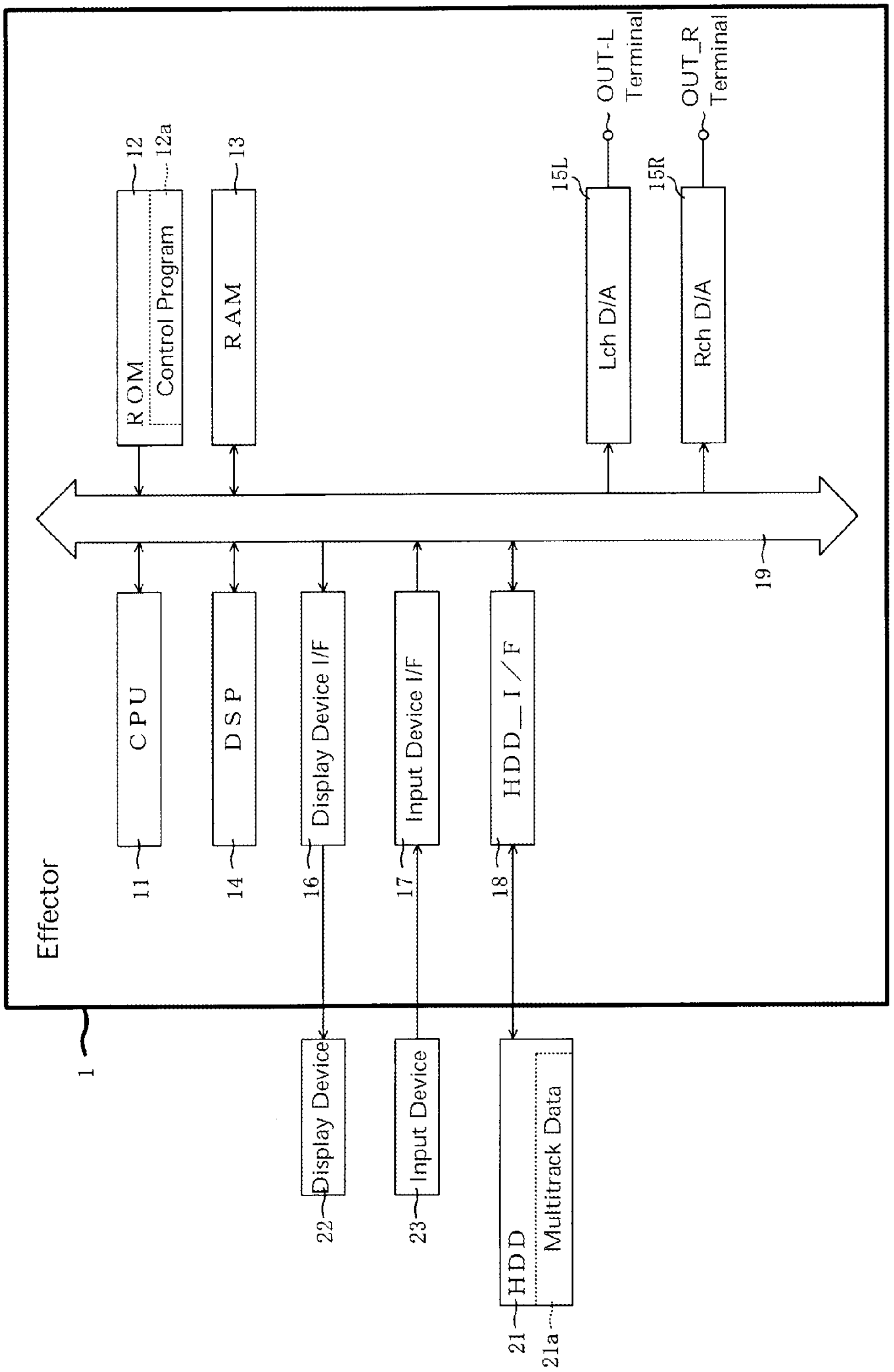
FIG. 1 is a block diagram showing a configuration of an effector (an example of a sound signal processing device) in accordance with an embodiment of the invention.

Preferred embodiments of the invention are described with reference to the accompanying drawings. A first embodiment of the invention is described with reference to FIGS. 1 through 6. FIG. 1 is a block diagram showing a configuration of an effector 1 (an example of a sound signal processing device) in accordance with the first embodiment of the invention. According to the effector 1 of the first embodiment, when performance sounds of multiple musical instruments performing a single musical composition are recorded on multiple tracks with each track used for recording a respective musical instrument, the effector 1 removes leakage sound included in recorded sounds on each track. The term "musical instruments" described in the present specification is deemed to include vocals.

The effector 1 includes a CPU 11, a ROM 12, a RAM 13, a digital signal processor (hereafter referred to as a "DSP") 14, a D/A for Lch 15L, a D/A for Rch 15R, a display device I/F 16, an input device I/F 17, HDD_I/F 18, and a bus line 19. The "D/A" is a digital to analog converter. Each of the sections 11-14, 15L, 15R and 16-18 are electrically connected with one another through the bus line 19.

The CPU 11 is a central control unit that controls each of the sections connected through the bus line 19 according to fixed values and control programs stored in the ROM 12 or the like. The ROM 12 is a non-rewritable memory that stores a control program 12*a* or the like to be executed by the effector 1. The control program 12*a* includes a control program for each process to be executed by the DSP 14 that is to be described below with reference to FIGS. 2-5. The RAM 13 is a memory that temporarily stores various kinds of data.

The DSP 14 is a device for processing digital signals. The DSP 14 in accordance with an embodiment of the present invention executes processes as described in greater detail below. The DSP 14 performs multitrack reproduction of multitrack data 21*a* stored in the HDD 21. Among recorded sound signals in a track of performance sounds of a musical instrument designated by the user, the DSP 14 discriminates sound signals of the main sound intended to be recorded in the track from sound signals of leakage sound recorded mixed with the main sound. For example, the sound intended to be recorded is performance sound of a musical instrument designated by the user, and this sound may be called hereafter "main sound." Then the DSP 14 extracts the signals of the discriminated main sound as "leakage-removed sound" and outputs the same to the Lch D/A 15L and the Rch D/A 15R.

The Lch D/A 15L is a converter that converts left-channel signals that were signal processed by the DSP 14, from digital signals to analog signals. The analog signals, after conversion, are outputted through an OUT_L terminal. The Rch D/A 15R is a converter that converts right-channel signals that were signal-processed by the DSP 14, from digital signals to analog signals. The analog signals, after conversion, are outputted through an OUT_R terminal.

Figure 6:
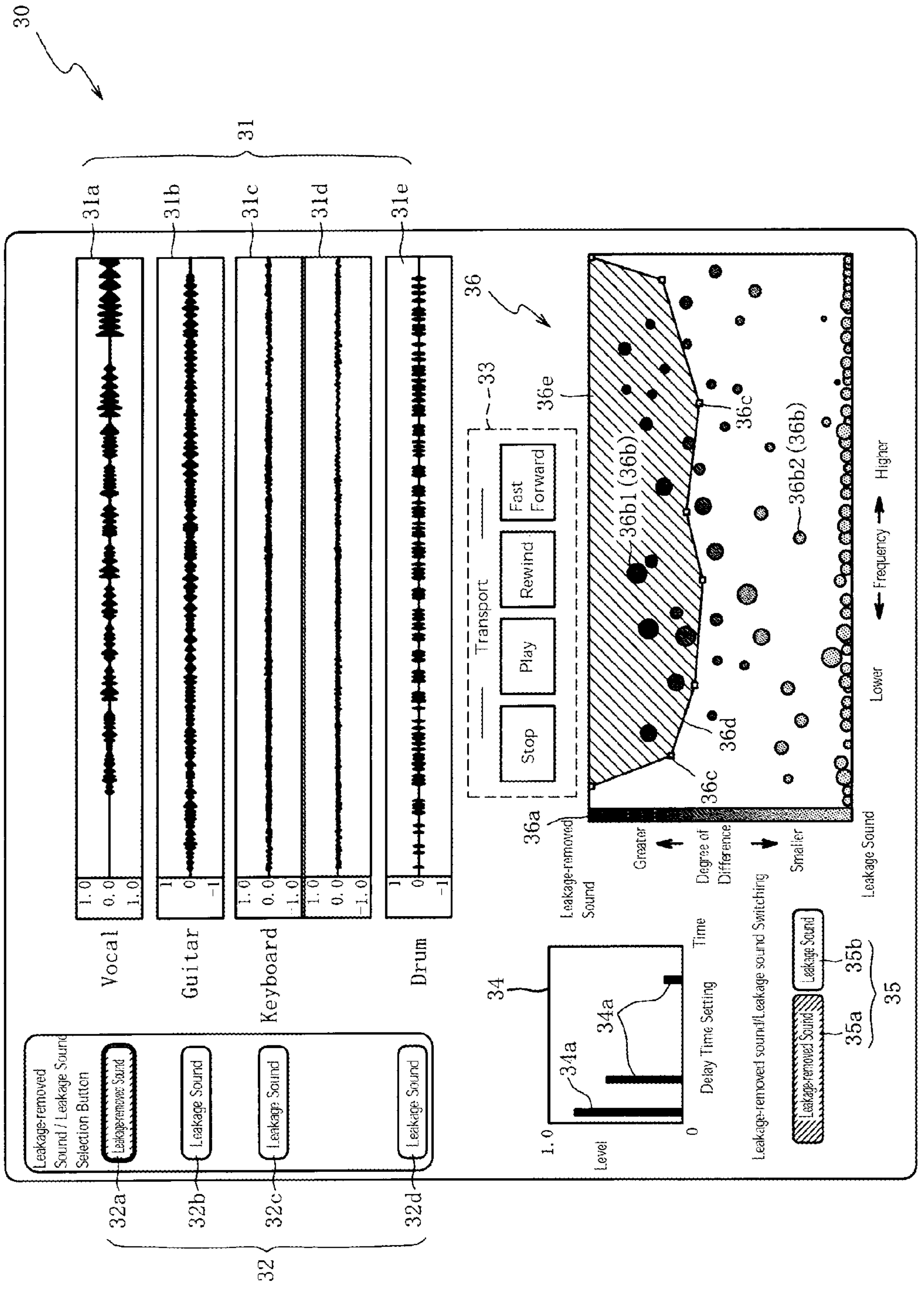
FIG. 6 is a schematic diagram showing an example of a user interface screen displayed on a display screen of a display device.

The display device I/F 16 is an interface for connecting with the display device 22. The effector 1 is connected to the display device 22 through the display device I/F 16. The display device 22 may be a device having a display screen of any suitable type, including, but not limited to an LCD display, LED display, CRT display, plasma display or the like. In accordance with the present embodiment, a user-interface screen 30 to be described below with reference to FIG. 6 is displayed on the display screen of the display device 22. The user-interface screen will be hereafter referred to as a "UI screen."

The input device I/F 17 is an interface for connecting with an input device 23. The effector 1 is connected to the input device 23 through the input device I/F 17. The input device 23 is a device for inputting various kinds of execution instructions to be supplied to the effector 1, and may include, for example, but not limited to, a mouse, a tablet, a keyboard, a touch-panel, button, rotary or slide operators, or the like. In one example, the input device 23 may be configured with a touch-panel that senses operations made on the display screen of the display device 22. The input device 23 is operated in association with the UI screen 30 (see FIG. 6) displayed on the display screen of the display device 22. Accordingly, various kinds of execution instructions may be inputted, for extracting leakage-removed sounds from recorded sounds on a track that records performance sounds of a musical instrument designated by the user.

The HDD_I/F 18 is an interface for connecting with an HDD 21 that may be an external hard disk drive. In the present embodiment, the HDD 21 stores one or a plurality of multitrack data 21*a*. One of the multitrack data 21*a* selected by the user is inputted for processing to the DSP 14 through the HDD_I/F 18. The multitrack data 21*a* is audio data recorded in multiple tracks.

Figure 2:
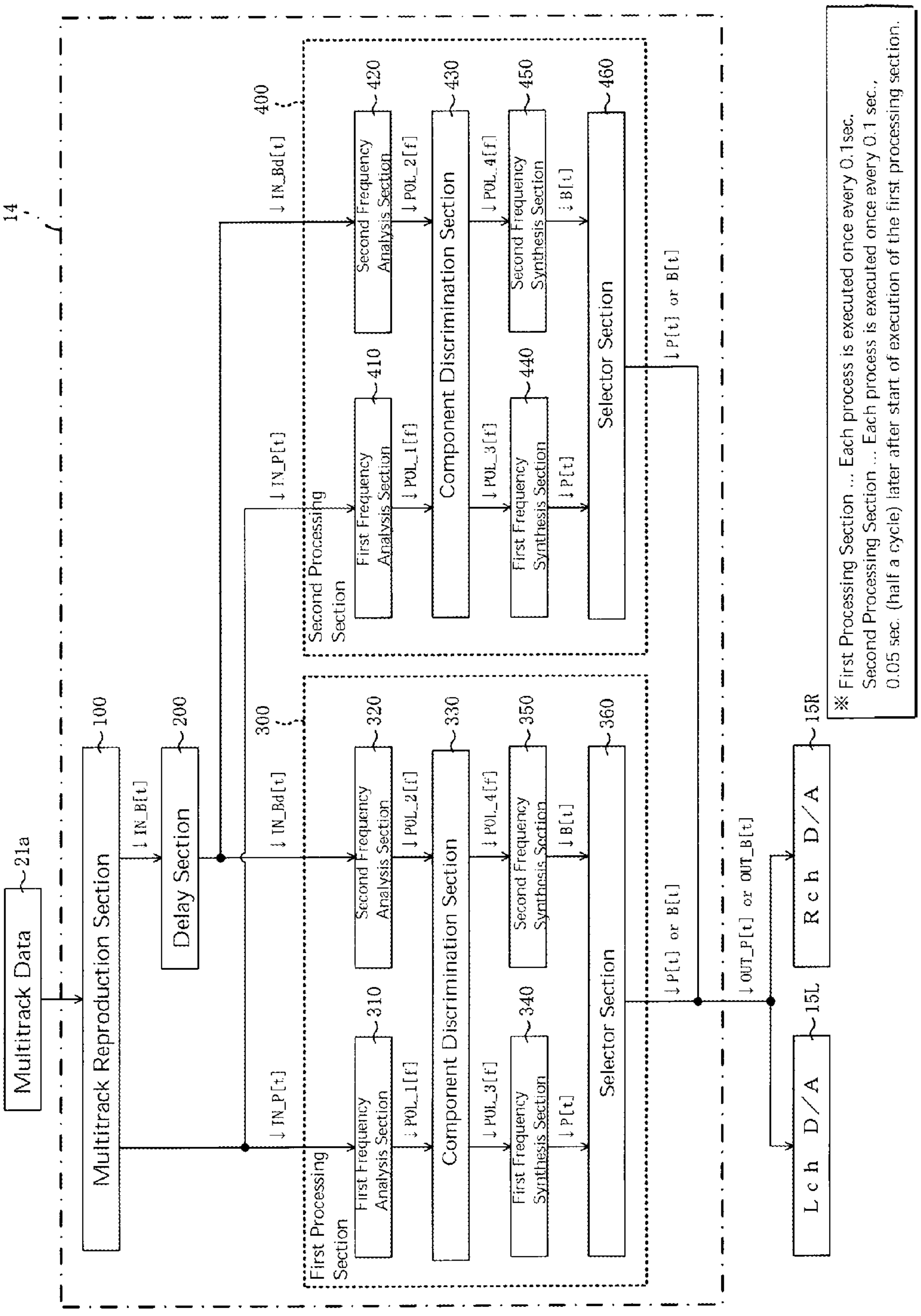
FIG. 2 is a functional block diagram showing functions of a DSP.

Example functions of the DSP 14 will be described with reference to FIG. 2. FIG. 2 is a functional block diagram showing functions of the DSP 14. Functional blocks formed in the DSP 14 include a multitrack reproduction section 100, a delay section 200, a first processing section 300, and a second processing section 400.

The multitrack reproduction section 100 reproduces, in multitrack format, the multitrack data 21*a* stored on the HDD 21. The multitrack reproduction section 100 can provide a signal IN_P [t] that is a reproduced signal based on recorded sounds on a track that records performance sounds of a musical instrument designated by the user. The multitrack reproduction section 100 inputs the signal IN_P [t] to a first frequency analysis section 310 of the first processing section 300 and a first frequency analysis section 410 of the second processing section 400. In the present specification, [t] denotes a signal in the time domain. Further, the multitrack reproduction section 100 inputs IN_B [t], which is a reproduced signal based on performance sounds recorded on tracks other than the track designated by the user, to the delay section 200. Further details of the multitrack reproduction section 100 will be described below with reference to FIG. 3.

The delay section 200 delays the signal IN_B [t] supplied from the multitrack reproduction section 100 by a delay time according to a setting selected by the user, and multiplies the signal with a predetermined level coefficient (a positive number of 1.0 or less). If there are multiple sets of the pair of a delay time and a level coefficient set by the user, all the results are added up. A delayed signal IN_Bd [t] thus obtained by the above processes is inputted in a second frequency analysis section 320 of the first processing section 300 and a second frequency analysis section 420 of the second processing section 400. Details of the delay section 200 will be described below with reference to FIG. 4.

The first processing section 300 and the second processing section 400 repeatedly and respectively execute common processings at predetermined time intervals, with respect to IN_P [t] supplied from the multitrack reproduction section 100 and IN_Bd [t] supplied from the delay section 200. In this manner, each of the first processing section 300 and the second processing section 400 outputs either a signal P[t] of leakage-removed sound, or a signal B[t] of leakage sound. The signals, P[t] or B[t] outputted from each of the first processing section 300 and the second processing section 400 are mixed by cross-fading, and outputted as OUT_P[t] or OUT_B[t], respectively. More specifically, when signals P[t] are outputted from the first processing section 300 and the second processing section 400, their mixed signal OUT_P[t] is outputted from the DSP 14. On the other hand, when signals B[t] are outputted from the first processing section 300 and the second processing section 400, their mixed signal OUT_B[t] is outputted from the DSP 14. Mixed signal OUT_P[t] or OUT_B[t] outputted from the DSP 14 is distributed and inputted in the Lch D/A 15L and the Rch D/A 15R, respectively.

The first processing section 300 includes the first frequency analysis section 310, the second frequency analysis section 320, a component discrimination section 330, a first frequency synthesis section 340, a second frequency synthesis section 350 and a selector section 360.

The first frequency analysis section 310 converts IN_P[t] supplied from the multitrack reproduction section 100 to a signal in the frequency domain, and converts the same from a Cartesian coordinate system to a polar coordinate system. The first frequency analysis section 310 outputs a signal POL_1[*f*] in the frequency domain expressed in the polar coordinate system to the component discrimination section 330. The second frequency analysis section 320 converts IN_Bd[t] supplied from the delay section 200 to a signal in the frequency domain, and converts the same from a Cartesian coordinate system to a polar coordinate system. The second frequency analysis section 320 outputs a signal POL_2[*f*] in the frequency domain expressed in the polar coordinate system to the component discrimination section 330.

The component discrimination section 330 obtains a ratio between an absolute value of the radius vector of POL_1[*f*] supplied from the first frequency analysis section 310 and an absolute value of the radius vector of POL_2[*f*] supplied from the second frequency analysis section 320 (hereafter this ratio is referred to as the "level ratio"). Then, the component discrimination section 330 compares the obtained ratio at each frequency f with the range of level ratios pre-set for the frequency f. Further, POL_3[*f*] and POL_4[*f*] set according to the comparison result are outputted to the first frequency synthesis section 340 and the second frequency synthesis section 350, respectively.

The first frequency synthesis section 340 converts POL_3 [*f*] supplied from the component discrimination section 330 from the polar coordinate system to the Cartesian coordinate system, and converts the same to a signal in the time domain. Further, the first frequency synthesis section 340 outputs the obtained signal P[t] in the time domain expressed in the Cartesian coordinate system to the selector section 360. The second frequency synthesis section 350 converts POL_4[*f*] supplied from the component discrimination section 330 from the polar coordinate system to the Cartesian coordinate system, and converts the same to a signal in the time domain. Further, the first frequency synthesis section 350 outputs the obtained signal B[t] in the time domain expressed in the Cartesian coordinate system to the selector section 360. The selector section 360 outputs either the signal P[t] supplied from the first frequency synthesis section 340 or the signal B[t] supplied from the second frequency synthesis section 350, based on a designation by the user.

P[t] is a signal of a leakage-removed sound, that is, of recorded sound from which unnecessary leakage sound is removed in a track that records sound of a musical instrument designated by the user. On the other hand, B[t] is a signal of leakage sound. In other words, the first processing section 300 can extract and output P[t] that is a signal of leakage-removed sound or B[t] that is a signal of leakage sound, in response to a designation by the user.

Further details of example processes executed by each of the sections 310-360 of the first processing section 300 will be described below with reference to FIG. 5.

The second processing section 400 includes the first frequency analysis section 410, the second frequency analysis section 420, a component discrimination section 430, a first frequency synthesis section 440, a second frequency synthesis section 450 and a selector section 460.

Each of the sections 410-460 composing the second processing section 400 functions in a similar manner as each of the sections 310-360 composing the first processing section 300, respectively, and outputs the same signal. More specifically, the first frequency analysis section 410 functions like the first frequency analysis section 310, and outputs POL_1 [f]. The second frequency analysis section 420 functions like the second frequency analysis section 320, and outputs POL_2[*f*]. The component discrimination section 430 functions like the component discrimination section 330, and outputs POL_3[*f*] and POL_4[*f*]. The first frequency analysis section 440 functions like the first frequency analysis section 340, and outputs P[t]. The second frequency analysis section 450 functions like the second frequency analysis section 350, and outputs B[t]. The selector section 460 functions like the selector section 360, and outputs either P[t] or B[t].

The execution interval of the processes executed by the second processing section 400 is the same as the execution interval of the processes executed by the first processing section 300. However, the processes executed by the second processing section 400 are started a predetermined time later, after starting of execution of processing by the first processing section 300. By this, the process executed by the second processing section 400 fills up a joining section from the completion of execution until the start of execution between each processing by the first processing section 300. On the other hand, the process executed by the first processing section 300 fills up a joining section from the completion of execution until the start of execution between each processing by the second processing section 400. Accordingly, it is possible to prevent occurrence of discontinuity in the mixed signal in which the signal outputted from the first processing section 300 and the signal outputted from the second processing section 400 are mixed (in other words, either OUT_P[t] or OUT_B[t] outputted from the DSP 14).

In an example embodiment, the first processing section 300 and the second processing section 400 execute their processing every 0.1 seconds. Also, a process to be executed by the second processing section 400 is started 0.05 seconds later (a half cycle later) from the start of execution of the process by the first processing section 300. It is noted, however, that the execution interval of the first processing section 300 and the second processing section 400 and the delay time from the start of execution of a process by the first processing section 300 until the start of execution of the process by the second processing section 400 are not limited to 0.1 seconds and 0.05 seconds exemplified above, and may be of any suitable values according to the sampling frequency and the number of musical sound signals.

Figure 3:
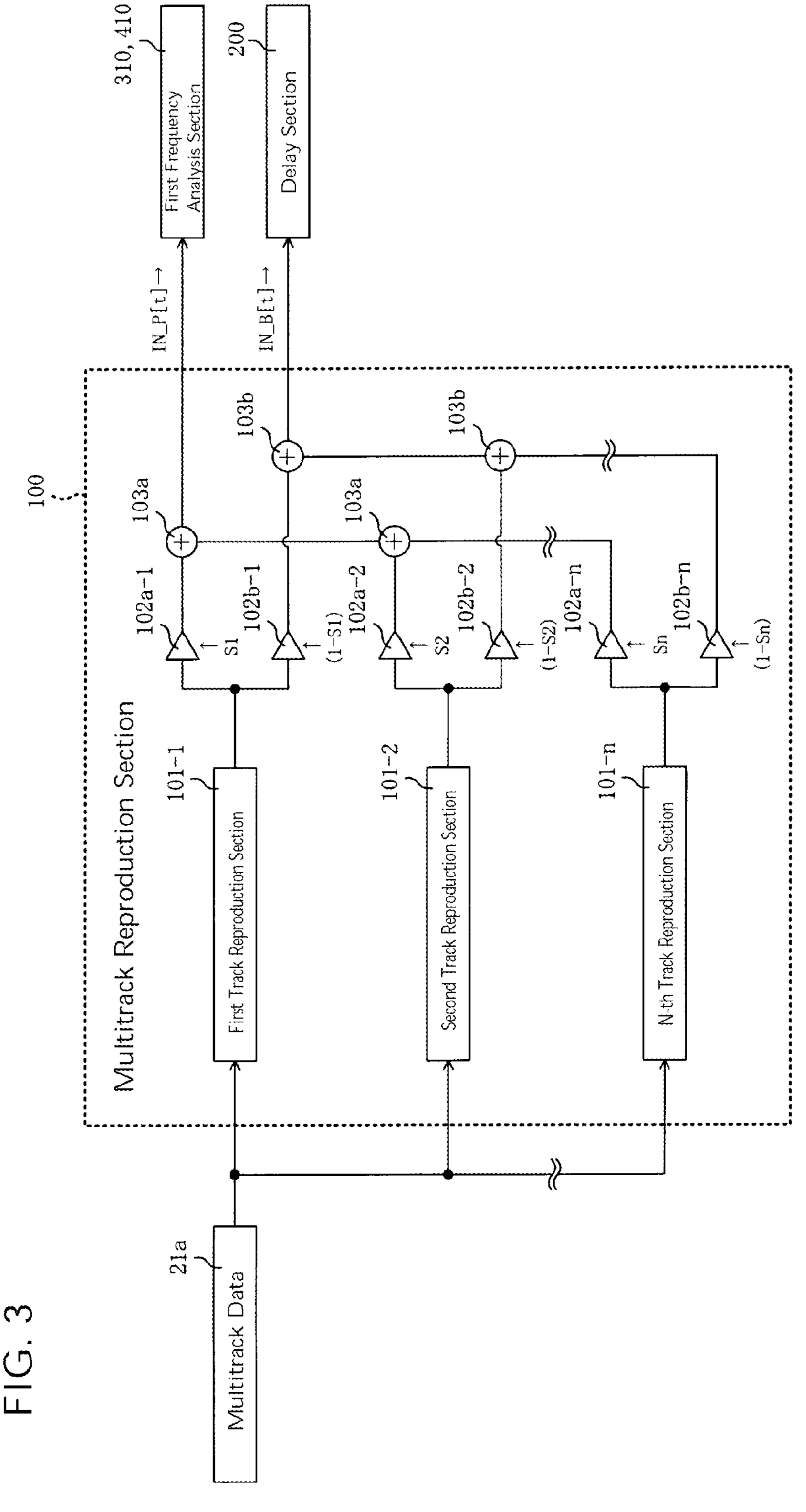
FIG. 3 is a functional block diagram showing functions of a multiple track generation section.

Next, referring to FIG. 3, functions of the multitrack reproduction section 100 will be described. FIG. 3 is a functional block diagram showing functions of the multitrack reproduction section 100. The multitrack reproduction section 100 is configured with first—n-th track reproduction sections 101-1 through 101-*n*, n first multipliers 102*a*-1 through 102*a*-*n*, n second multipliers 102*b*-1 through 102*b*-*n*, a first adder 103*a* and a second adder 103*b*, where n is an integer greater than 1.

The first—n-th track reproduction sections 101-1 through 101-*n* execute multitrack reproduction through synchronizing and reproducing single track data composing the multitrack data 21*a*. Each of the "single track data" is audio data recorded on one track.

Each of the track reproduction sections 101-1 through 101-*n* synchronizes and reproduces one or plural single track data of recorded performance sound of one musical instrument from among the sets of single track data composing the multitrack data 21*a*. Each of the track reproduction sections 101-1 through 101-*n* outputs a monaural reproduced signal of the performance sound of the musical instrument. Each track reproduction section is not necessarily limited to reproducing one single track data. For example, when performance sounds of one musical instrument are recorded in stereo on multiple tracks, reproduced sounds of sets of the single track data respectively corresponding to the multiple tracks are mixed and outputted as a monaural reproduced signal. The track reproduction sections 101-1 through 101-*n* output the monaural reproduced signals to the corresponding respective first multipliers 102*a*-1 through 102*a*-*n*, and the corresponding respective second multipliers 102*b*-1 through 102*b*-*n*.

The first multipliers 102*a*-1 through 102*a*-*n* multiply the reproduced signals inputted from the corresponding track reproduction sections 101-1 through 101-*n* by coefficients S1 through Sn, respectively, and output the signals to the first adder 103*a*. The coefficients S1 through Sn are each a positive number of 1 or less. The second multipliers 102*b*-1 through 102*b*-*n* multiply the reproduced signals inputted from the corresponding track reproduction sections 101-1 through 101-*n* by coefficients (1-S1) through (1-Sn), respectively, and output the signals to the first adder 103*a*.

The first adders 103*a* add all the signals outputted from the first multipliers 102*a*-1 through 102*a*-*n*. The first adders 103*a* obtain a signal IN_P[t] and input that signal to the first frequency analysis section 310 of the first processing section 300 and the first frequency analysis section 410 of the second processing section 400, respectively. The second adders 103*b* add all the signals outputted from the second multipliers 102*b*-1 through 102*b*-*n*. The second adders 103*b* obtain a signal IN_B[t] and input that signal to the delay section 200.

In accordance with an embodiment of the invention, the user may designate sound of one musical instrument to be extracted as leakage-removed sound on the UI screen 30 to be described below (see FIG. 6). The values of the coefficients S1-Sn used by the first multipliers 102*a*-1 through 102*a*-*n* are specified depending on whether sounds of a musical instrument to be reproduced by the corresponding track reproduction sections 101-1 through 101-*n* are the sounds of the musical instrument designated by the user. More specifically, the values of the coefficients S1-Sn corresponding to those of the track reproduction sections 101-1 through 101-*n* that mainly include sounds of the musical instrument designated as the leakage-removed sound are set at 1.0. The values of the coefficients S1-Sn corresponding to the other track reproduction sections are set at 0.0.

On the other hand, the values of the coefficients used by the second multipliers 102*b*-1 through 102*b*-*n* are decided according to the values of the corresponding coefficients S1-Sn. In other words, when the coefficients S1-Sn used by the first multipliers 102*a*-1 through 102*a*-*n* are 1.0, the coefficients (1-S1) through (1-Sn) to be used by the second multipliers 102*b*-1 through 102*b*-*n* are set at 0.0. Also, when the coefficients S1-Sn are 0.0, the corresponding coefficients (1-S1) through (1-Sn) are set at 1.0.

In other words, the multitrack reproduction section 100 outputs to the first frequency analysis sections 310 and 410 as IN_P[t], the reproduced signals outputted from those of the track reproduction sections 101-1 through 101-*n* that mainly include sounds of the musical instrument designated as the leakage-removed sound. The reproduced signals outputted from the other track reproduction sections are not included in IN_P[t]. On the other hand, the multitrack reproduction section 100 outputs the reproduced signals outputted from those of the track reproduction sections that mainly include sounds of musical instruments other than the sounds of the musical instrument designated as the leakage-removed sound to the delay section 200 as IN_B[t]. The reproduced signals outputted from the track reproduction sections 101-1 through 101-*n* designated as the leakage-removed sound are not included in IN_B[t].

As an example, a case when vocal sound (voices of a vocalist) is designated by the user as leakage-removed sound will be described. IN_P[t] outputted from the multitrack reproduction section 100 to the first frequency analysis sections 310 and 410 is composed of mixed sounds of the main sound and unnecessary sounds (leakage sounds that overlap the main sound). In this example, the main sound corresponds to a signal of the vocal sound (Vo[t]). The unnecessary sounds correspond to signals in which the signals of mixed sounds B[t] of the sounds of the other musical instruments are changed by the characteristic Ga[t] of the sound field space. In other words, IN_P[t]=Vo[t]+Ga[B[t]].

On the other hand, IN_B[t] outputted from the multitrack reproduction section 100 to the delay section 200 corresponds to signals of unnecessary sounds (B[t]). For example, when B[t] corresponds to signals of mixed sounds including a signal of performance sound of a guitar (Gtr[t]), a signal of performance sound of a keyboard (Kbd[t]), a signal of performance sound of drums (Drum[t]) and the like, IN_B[t] corresponds to the sum of the sound signals of those musical instruments. In other words, IN_B[t]=Gtr[t]+Kbd[t]+Drum[t]+ . . . .

Figure 4:
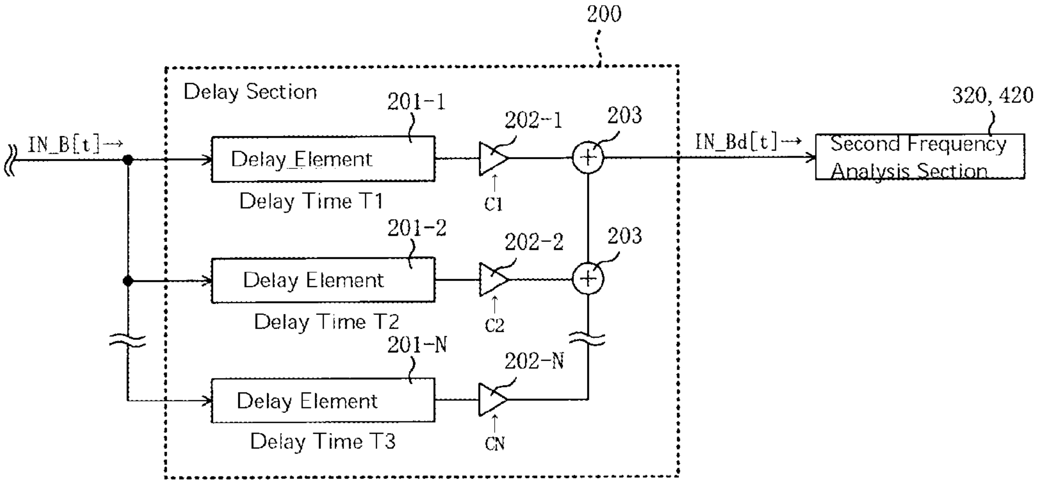
FIG. 4 (*a*) is a functional block diagram showing functions of a delay section.
Figure 4:
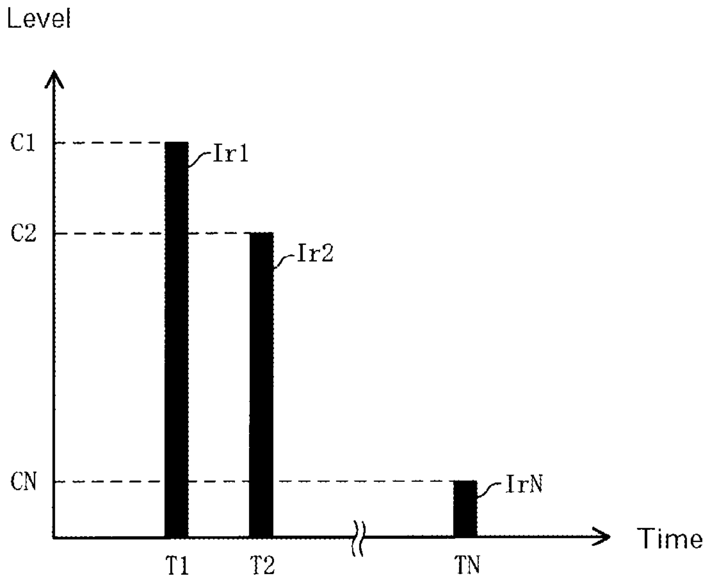

Referring to FIG. 4, functions of the delay section 200 described above will be described. FIG. 4(*a*) is a functional block diagram showing functions of the delay section 200. The delay section 200 is an FIR filter, and includes first through N-th delay elements 201-1 through 201-N, N multipliers 202-1 through 202-N, and an adder 203, where N is an integer greater than 1.

The delay elements 201-1 through 201-N are elements that delay the input signal IN_B[t] by delay times T1-TN respectively specified for each of the delay elements. The delay elements 201-1 through 201-N output the delayed signals to the corresponding multipliers 202-1 through 202-N, respectively.

The multipliers 202-1 through 202-N multiply the signals supplied from the corresponding delay elements 201-1 through 201-N by level coefficients C1-CN (all of them being a positive number of 1.0 or less), respectively, and output the signals to the adders 203. The adders 203 add all the signals outputted from the multipliers 202-1 through 202-N. The adders 203 obtain a signal IN_Bd[t] and input that signal to the second frequency analysis section 320 of the first processing section 300 and the second frequency analysis section 420 of the second processing section 400, respectively.

The number of the delay elements 201-1 through 201-N (i.e., N) in the delay section 200, the delay times T1-TN, and the level coefficients C1-CN are suitably set by the user. The user operates a delay time setting section 34 in the UI screen 30 (see FIG. 6) as described below to set these values. Among the delay times T1-TN, at least one of the delay times may be zero (in other words, no delay is set). The number of the delay elements 201-1 through 201-N may be set to the number of output sources of leakage sound, and the delay times T1-TN and the level coefficients C1-CN may be set for the respective delay elements, whereby impulse responses Ir1-IrN shown in FIG. 4(*b*) can be obtained. By convolution of these impulse responses Ir1-IrN with IN-B[t], IN_Bd[t] is generated. When performance sound is to be collected on a certain track by a sound collecting device (e.g., a microphone or the like), the sound collecting device collects sound of a musical instrument (i.e., the main sound) to be recorded on the track, as well as sounds other than the main sound. Output sources of those sounds are output sources of leakage sounds, which may be, for example, loudspeakers, musical instruments such as drums, and the like.

When there are N output sources of leakage sounds, the IN_Bd[t] to be generated by the delay section 200 can be expressed as $IN\_Bd[t]=IN\_B[t]\times C1\times Z^{-m1}+IN\_B[t]\times C2\times Z^{-m2}+\ldots+IN\_B[t]\times CN\times Z^{-mN}$. It is noted that Z is a transfer function of Z-transform, and indexes of the transfer function Z (−m1, −m2, . . . −mN) are decided according to the delay times T1-TN, respectively. More specifically, consider a case when accompaniment with musical sounds other than vocals are recorded in multitrack (with delay times being zero), and vocals are recorded on a track while the recorded multitrack sounds are reproduced, and the reproduced sounds are emanated from stereo speakers. In this case, output sources of leakage sounds are the speakers at two locations, on the right and left sides (i.e., N=2). The delay times are decided based on the distance from the respective speakers to the vocal microphone.

FIG. 4(*b*) is a graph schematically showing impulse responses to be convoluted with the input signal (i.e., IN_B[t]) at the delay section 200 shown in FIG. 4 (*a*). In FIG. 4 (*b*), the horizontal axis represents time, and the vertical axis represents levels. The first impulse response Ir1 is an impulse response with the level C1 at the delay time T1, and the second impulse response Ir2 is an impulse response with the level C2 at the delay time T2. Further, the N-th impulse response IrN is an impulse response with the level CN at the delay time TN.

The distance between each of the N output sources of leakage sound and the sound collection device for collecting the main sound, and the degree of overlapping sound outputted from each of the output sources of leakage sound (for example, the sound volume of the overlapping sound) and the like are reflected on each of the impulse responses Ir1, Ir2, . . . IrN. In other words, each of the impulse responses Ir1, Ir2, . . . IrN reflects Ga[t] that expresses the characteristic of the sound field space. As described above, the impulse responses Ir1, Ir2, . . . IrN can be obtained by setting the number N of the delay elements, the delay times T1-TN, and the level coefficients C1-CN, using the UI screen 30. Therefore, by suitably setting the impulse responses Ir1, Ir2, . . . IrN, and convoluting the input signal IN_B[t] therewith, an IN_Bd[t] that suitably simulates the leakage sound component (Ga[B [t]]) included in IN-P[t] can be generated and outputted.

Figure 5:
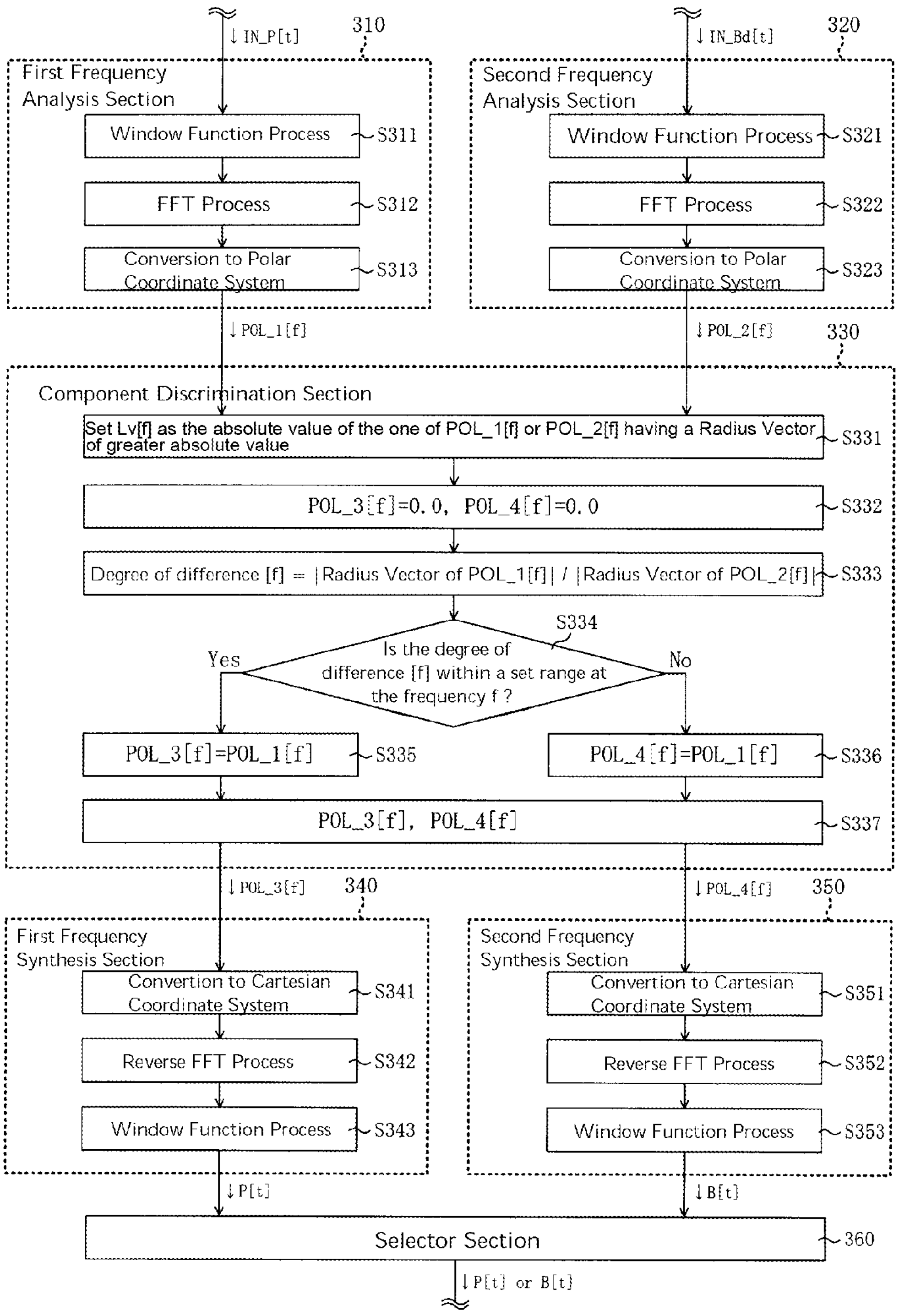
FIG. 5 is a schematic diagram with functional blocks showing a process executed by the respective components composing a first processing section.

Referring to FIG. 5, functions of the first processing section 300 will be described. FIG. 5 schematically shows, with functional blocks, processes executed by each of the sections 310-360 of the first processing section 300. Each of the sections 410-460 of the second processing section 400 executes processes similar to those of the sections 310-360 shown in FIG. 5.

The first frequency analysis section 310 executes a process of multiplying IN_P[t] supplied from the multitrack reproduction section 100 with a window function (S311). In the present embodiment, a Hann window is used as the window function.

Then, the windowed signal IN_P[t] is subjected to a fast Fourier transform (FFT) (S312). By the fast Fourier transform, IN_P[t] is transformed into IN_P[f], which represents spectrum signals plotted versus Fourier-transformed frequency f as abscissas. IN_P[f] is a complex number having a real part (Re[f]) and an imaginary part (jIm[f]) (i.e., IN_P[f]=Re[f]+jIm[f]).

After the process in S312, IN_P[f] is transformed into a polar coordinate system (S313). More specifically, Re[f]+jIm[f] at each frequency f is transformed into r[f] (cos(arg[f]))+jr[f] (sin(arg[f])). POL_1[*f*] outputted from the first frequency analysis section 310 to the component discrimination section 330 is r[f] (cos(arg[f]))+jr[f] (sin(arg[f])) that is obtained by the process in S313.

It is noted that r[f] is a radius vector, and can be calculated by the square root of the sum of a value of the square of the real part of IN_P[f] and a value of the square of the imaginary part thereof. In other words, $r[f]=\{(Re[f])^2+(Im[f])^2\}^{1/2}$. Also, arg[f] is a phase, and can be calculated by the arctangent of a value obtained by dividing the imaginary part by the real part of IN_P[f]. In other words, $art[f]=\tan^{-1}(Im[f]/Re[f])$.

The second frequency analysis section 320 executes a windowing with respect to IN_Bd[t] supplied from the delay section 200 (S321), executes an FFT process (S322), and executes a transformation into the polar coordinate system (S323). The processing contents of the processes in S321-

S323 that are executed by the second frequency analysis section 320 are generally the same as those processes in S311-S313 described above, except that the processing target IN_P[t] changes to IN_Bd[t]. Accordingly, description of the details of these processes is omitted. The output signal of the second frequency analysis section 320 becomes POL_2[*f*], because the processing target is changed to IN_Bd[t].

The component discrimination section 330, at first, compares the radius vector of POL_1[*f*] with the radius vector of POL_2[*f*], and sets, as Lv[f], the absolute value of the radius vector with a greater absolute value (S331). Lv[f] set in S331 is supplied to the CPU 11, and is used for controlling the display of the signal display section 36 of the UI screen (see FIG. 6) to be described below.

After the processing in S331, POL_3[*f*] and POL_4[*f*] at each frequency f are initialized to zero (S332). Next, the degree of difference [f]=|Radius Vector of POL_1[*f*]|/|Radius Vector of POL_2[*f*]| is calculated for each frequency f (S333). As is clear from the above, the degree of difference [f] is a value specified according to the ratio between the level of POL_1[*f*] and the level of POL_2[*f*]. In other words, the degree of difference [f] presents a value that expresses the degree of difference between the input signal (IN_P[t]) corresponding to POL_1[*f*] and the input signal (i.e., IN_Bd[t] that is a delay signal of IN_B[t]) corresponding to POL_2[*f*]. In 5333, the degree of difference [f] is limited to a range between 0.0 and 2.0. In other words, when |Radius Vector of POL_1[*f*]|/|Radius Vector of POL_2[*f*]| exceeds 2.0, the degree of difference [f]=2.0. Also, when the radius vector of POL_2[*f*] is 0.0, the degree of difference [f] also equals to 2.0. The degree of difference [f] calculated in S333 will be used in processes in S334 and thereafter, and supplied to the CPU 11 and used for controlling the signal display section 36 on the UI screen (see FIG. 6) to be described below.

Next, it is judged, at each frequency f, as to whether the degree of difference [f] is within the range set at the frequency f (S334). The "range set at the frequency f" is the range of degrees of difference [f] at a certain frequency f in which sounds are determined to be leakage-removed sounds (or sounds to be extracted as P[t]). The range of degrees of difference [f] is set by the user, using the UI screen 30 (see FIG. 6) to be described below. Therefore, when the degree of difference [f] at a frequency f is within the set range, it means that POL_1[*f*] at that frequency is a signal of leakage-removed sound.

When the judgment in S334 is affirmative (S334: Yes), POL_3[*f*] is set to POL_1[*f*] (S335); and when it is negative (S334: No), POL_4[*f*] is set to POL_1[*f*] (S336). Therefore, POL_3[*f*] is a signal corresponding to leakage-removed sound extracted from POL_1[*f*]. On the other hand, POL_4[*f*] is a signal corresponding to leakage sound extracted from POL_1[*f*].

After the process in S335 or S336, POL_3[*f*] at each frequency f is outputted to the first frequency synthesis section 340, and POL_4[*f*] at each frequency f is outputted to the second frequency synthesis section 350 (S337).

At a frequency fat which the process in S335 is executed upon an affirmative judgment in S334, POL_1[*f*] is outputted as POL_3[*f*] to the first frequency synthesis section 340 by the process in S337. Also, 0.0 is outputted as POL_4[*f*] to the second frequency synthesis section 350. On the other hand, at a frequency fat which the process in S336 is executed upon a negative judgment in S334, 0.0 is outputted as POL_3[*f*] to the first frequency synthesis section 340 by the process in S337. In addition, POL_1[*f*] is outputted as POL_4[*f*] to the second frequency synthesis section 350. The processes from S331 through S337 described above are repeatedly executed within the range of the Fourier-transformed frequencies f.

The first frequency synthesis section 340 first transforms, at each frequency f, POL_3[*f*] supplied from the component discrimination section 330 into a Cartesian coordinate system (S341). In other words, r[f] (cos(arg[f]))+jr[f](sin(arg[f])) at each frequency f is transformed into Re[f]+jIm[f]. More specifically, r[f](cos(arg[f])) is set as Re[f], and jr[f](sin(arg[f])) is set as jIm[f], thereby performing the transformation. In other words, Re[f]=r[f](cos(arg[f])), and jIm[f]=jr[f] (sin(arg[f])).

Then, a reverse fast Fourier transform (reverse FFT) is applied to the signals of the Cartesian coordinate system (i.e., the signals in complex numbers) obtained in S341, thereby obtaining signals in the time domain (S342). Then, the signals obtained are multiplied by the same window function as the window function used in the process in S311 by the frequency analysis section 310 described above (S343). Further, the signals obtained are outputted as P[t] to the selector section 360. In embodiments in which a Hann window is used in the process in S311, the Hann window is also used in the process in S343.

The second frequency synthesis section 350 transforms, for each frequency f, POL_4[*f*] supplied from the component discrimination section 330 into a Cartesian coordinate system (S351), executes a reverse FFT process (S352), and executes a windowing (S353). The processes in S351-S353 that are executed by the second frequency synthesis section 350 are similar to those processes in S341-S343 described above, except that the signal POL_3[*f*] supplied from the component discrimination section 330 changes to POL_4[*f*]. Accordingly, description of the details of these processes is omitted. The output signal of the second frequency synthesis section 350 becomes B[t], instead of P[t], because the signal supplied from the component discrimination section 330 changes to POL_4[*f*].

As described above, POL_3[*f*] are signals corresponding to leakage-removed sound extracted from POL_1[*f*]. Therefore, P[t] outputted from the first frequency synthesis section 340 to the selector section 360 are signals in the time domain of the leakage-removed sound. On the other hand, POL_4[*f*] are signals corresponding to leakage sound extracted from POL_1[*f*]. Therefore, B[t] outputted from the second frequency synthesis section 350 to the selector section 360 are signals in the time domain of the leakage sound.

The selector section 360 outputs either P[t] supplied from the first frequency synthesis section 340 or B[t] supplied from the second frequency synthesis section 350 in response to a designation by the user. The designation by the user is performed on the UI screen 30 to be described below with reference to FIG. 6.

Either the signal P[t] or B[t] is outputted from the selector section 360 of the first processing section 300. On the other hand, the selector section 460 of the second processing section 400 outputs P[t] or B[t], which is the same kind of signal outputted from the selector section 360. These signals are mixed together, and the mixed signals are outputted to D/A 15L and D/A 15R.

As described above, P[t] presents signals of leakage-removed sound, and B[t] presents signals of leakage sound. Therefore, the effector 1 of the present embodiment can output sound without leakage sound (where leakage sound has been removed) from a track that records sound of a musical instrument designated by the user, as the main sound. Also, depending on a condition designated by the user, sound corresponding to leakage sound in that case can be outputted.

FIG. 6 is a schematic diagram showing an example of a UI screen 30 displayed on the display screen of the display device 22. The UI screen 30 includes a track display section 31, a selection button 32, a transport button 33, a delay time setting section 34, a switching button 35 and a signal display section 36.

The track display section 31 is a screen that displays audio waveforms recorded in single track data sets included in the multitrack data 21*a*. When one multitrack data 21*a* intended to be processed by the user is selected, audio waveforms are displayed in the track display section 31 separately for each of the single track data sets. In the example shown in FIG. 6, five display sections 31*a*-31*e* are displayed. The display sections 31*a*, 31*b* and 31*e* are screens for displaying audio waveforms of the tracks that record in monaural vocal sounds, guitar sounds and drums sounds as main sounds, respectively. The display sections 31*c* and 31*d* are screens for displaying waveforms of sounds on the respective left and right channels of keyboard sounds that are recorded in stereo. In each of the display sections 31*a*-31*e*, the horizontal axis corresponds to the time and the vertical axis corresponds to the amplitude.

The selection buttons 32 include buttons for designating sound of musical instruments to be extracted as leakage-removed sound. Each of the selection buttons 32 is provided for each musical instrument that emanates the main sound on each of the single track data sets of the multitrack data 21*a*. In the example shown in FIG. 6, four selection buttons 32 are provided. More specifically, there are a selection button 32*a* corresponding to vocal sound (vocalist), a selection button 32*b* corresponding to guitar sound (guitar), a selection button 32*c* corresponding to keyboard sound (keyboard), and a selection button 32*d* corresponding to drums sound (drums).

The selection buttons 32 can be operated by the user, using the input device 23 (for example, a mouse). When a specified operation (for example, a click operation) is applied to one of the selection buttons, the selection button is placed in a selected state, and the musical instrument corresponding to the selection button in the selected state is selected as a musical instrument that is subjected to removal of leakage sound. Linked with this selection, the musical instruments corresponding to the remaining selection buttons are selected as musical instruments that are designated as leakage sound sources. In this instance, among the coefficients S1-Sn to be used by the multitrack reproduction section 100, the coefficient corresponding to the musical instrument that is subjected to leakage sound removal is set at 1.0, and the remaining coefficients are set at 0.0. In the example shown in FIG. 6, the selection button 32*a* is in the selected state (a character display of "Leakage-removed Sound" in a color, tone, highlight or other user-detectable state indicating that the button is selected). In this case, the vocal sound is selected as being subjected to removal of leakage sound. On the other hand, the other selection buttons 32*b*-32*d* are in the non-selected state (a character display of "Leakage Sound" in a color, tone, highlight or other user-detectable state indicating that the buttons are not selected). In other words, the guitar sound, the keyboard sound and the drums sound are selected as being designated as leakage sound.

The transport button 33 includes a group of buttons for manipulating the multitrack data 21*a* to be processed. The transport button 33 includes, for example, a play button for reproducing the multitrack data 21*a* in multitracks, a stop button for stopping reproduction, a fast forward button for fast forwarding reproduced sound or data, a rewind button for rewinding reproduced sound or data, and the like. The transport button 33 can be operated by the user, using the input device 23 (for example, a mouse). In other words, each button in the group of buttons included in the transport button 33 can be operated by applying a specified operation (for example, a click operation) to that button.

The delay time setting section 34 is a screen for setting parameters to be used to delay IN_B[t] at the delay section 200. The delay time setting section 34 screen has a horizontal axis that corresponds to time and a vertical axis that corresponds to the level. The delay time setting section 34 displays bars 34*a* that are set by the user through operating the input device 23.

The number of bars 34*a* corresponds to the number N of output sources of leakage sound. The user can suitably add or erase these bars by performing a predetermined operation using the input device 23 (for example, a mouse). The predetermined operation may be, for example, clicking the right button on the mouse to select the operation in a displayed menu. In the example shown in FIG. 6, three bars 34*a* are displayed, which means that "3" is set as the number N of output sources of leakage sound. Also, each bar 34*a* is set with a delay time Tx (x=any of 1-N) defining a position measured from time 0 (zero) in the horizontal axis direction. Also, each bar 34*a* is set with a level coefficient Cx (x=any of 1-N) defining the height measured from level 0 (zero) in the vertical axis direction. Shifting each of the bars 34*a* in the horizontal axis direction (in other words, changing the delay time Tx), and changing the height thereof in the vertical axis direction (in other words, changing the level coefficient Cx) can be done by a predefined operation with the input device 23. For example, while the cursor is placed on one of the bars 34*a* intended to be changed, the mouse may be moved in the horizontal axis direction or in the vertical axis direction while depressing the left button on the mouse, whereby the position or the height of the bar can be changed.

The switching button 35 includes buttons 35*a* and 35*b* that are used to designate signals outputted from the selector sections 360 and 460 to be signals of leakage-removed sound (P[t]) or signals of leakage sound (B[t]). The button 35*a* is a button for designating signals of leakage-removed sound (P[t]), and the button 35*b* is a button for designating signals of leakage sound (B[t]).

The switching button 35 may be operated by the user, using the input device 23 (for example a mouse). When the button 35*a* or the button 35*b* is operated (for example, clicked), the clicked button is placed in a selected state, whereby signals corresponding to the button are designated as signals to be outputted from the selector sections 360 and 460. In the example shown in FIG. 6, the button 35*a* is in the selected state (is in a color, tone, highlight or other user-detectable state indicating that the button is selected). More specifically, signals of leakage-removed sound (P[t]) are designated (selected) as signals to be outputted from the selector section 360 and 460. On the other hand, the button 35*b* is in a non-selected state (in a color, tone, highlight or other user-detectable state indicating that the button is not selected).

The signal display section 36 is a screen for visualizing input signals to the effector 1 (in other words, input signals from the multitrack data 21*a*) on a plane of the frequency f versus the degree of difference [f]. As described above, the degree of difference [f] represents values indicating the degree of difference between IN_P[t] and IN_Bd[t] that represents delay signals of IN_B[t]. The horizontal axis of the signal display section 36 represents the frequency f, which becomes higher toward the right, and lower toward the left. On the other hand, the vertical axis represents the degree of difference [f], which becomes greater toward the upper side, and smaller toward the bottom side. The vertical axis is appended with a color bar 36*a* that expresses the magnitude of the degree of difference [f] with different colors. The color bar 36*a* is colored with gradations that sequentially change from dark purple (when the degree of difference [f]=0.0)→ purple→indigo blue→blue→green→yellow→orange→ red→dark red (when the degree of difference [f]=2.0), as the degree of difference [f] becomes greater.

The signal display section 36 displays circles 36*b* each having its center at a point defined according to the frequency f and the degree of difference [f] of each input signal. The coordinates of these points (the frequency f and the degree of difference [f]) are calculated by the CPU 11 based on values calculated in the process 5333 by the component discrimination section 330. The circles 36*b* are colored with colors in the color bar 36*a* respectively corresponding to the degrees of difference [f] indicated by the coordinates of the centers of the circles. Also, the radius of each of the circles 36*b* represents Lv[f] of an input signal of the frequency f, and the radius becomes greater as Lv[f] becomes greater. It is noted that Lv[f] represents values calculated by the process in S331 (by the component discrimination section 330). Therefore, the user can intuitively recognize the degree of difference [f] and Lv[f] by the colors and the sizes (radius) of the circles 36*b* displayed in the signal display section 36.

A plurality of designated points 36*c* displayed in the signal display section 36 are points that specify the range of settings used for the judgment in S334 by the component discrimination section 330. A boundary line 36*d* is a linear line connecting adjacent ones of the designated points 36*c*, and a line that specifies the border of the setting range. An area 36*e* surrounded by the boundary line 36*d* and the upper edge (i.e., the maximum value of the degree of difference [f]) of the signal display section 36 defines the range of settings used for the judgment in S334 by the component discrimination section 330.

The number of the designated points 36*c* and initial values of the respective positions are stored in advance in the ROM 12. The user may use the input device 23 to increase or decrease the number of the designated points 36*c* or to change their positions, whereby an optimum range of settings can be set. For example, when the input device 23 is a mouse, the cursor may be placed on the boundary line 36*d* in proximity to an area where a designated point 36*c* is to be added, and the left button on the mouse may be depressed, whereby another designated point 36*c* can be added. At this time, the added designated point 36*c* is in the selected state, and can therefore be shifted to a suitable position by shifting the mouse while the left button is kept depressed. Also, the cursor may be placed on any of the designated points 36*c* desired to be removed, and the right button on the mouse may be clicked to display a menu and select deletion in the displayed menu, whereby the specified designated point 36*c* can be deleted. Also, the cursor may be placed on any of the designated points 36*c* desired to be moved, and the left button on the mouse may be clicked, whereby the specified designated points 36*c* can be placed in a selected state. In this state, by moving the mouse while the left button is being depressed, the selected designated point can be moved to a suitable position. The selected state may be released by releasing the left button.

Signals corresponding to circles 36*b*1 among the circles 36*b* displayed in the signal display section 36, whose centers are included inside the range 36*e* (including the boundary), are judged in S334 by the component discrimination section 330 to be the signals whose degree of difference [f] at that frequency f are within the range of settings. On the other hand, signals corresponding to circles 36*b*2 whose centers are outside the range 36*e* are judged in S334 by the component discrimination section 330 to be the signals outside the range of settings.

As described above, in the effector 1 in accordance with an embodiment of the present invention, a track that records performance sound of a musical instrument among the multitrack data 21*a* is designated by the user. The delay section 200 delays IN_B[t], which represents reproduced signals of tracks other than the track designated by the user. Accordingly, it is possible to obtain IN_Bd[t] that is a signal assimilating the signal G[B[t]], which is the signal B[t] of leakage sound modified by the characteristic G[t] of the sound field space, included in the data IN_P[t] of the track designated by the user. The level ratio, at each frequency f, between the signals respectively obtained by frequency analysis of IN_Bd [t] and IN_P[t] (|Radius Vector of POL_1[*f*]|/|Radius Vector of POL_2[*f*]|) expresses the degree of difference between these two signals. In other words, the higher the level ratio, the more signal components that are not included in IN_Bd[t] (in other words, signals of leakage-removed sound P[t] included in IN_P[t]). Therefore, the level ratios can be used as indexes for discriminating signals of leakage-removed sound (P[t]) included in IN_P[t] from signals of leakage sound B[t]. Thus, signals of leakage-removed sound P[t] can be extracted from IN_P[t], according to the level ratios.

Extraction of P[t] is performed, focusing on the frequency characteristic and the level ratio, and does not accompany deduction of waveforms pseudo-generated on the time axis. Therefore the extraction can be readily accomplished, and sounds can be extracted with good sound quality. Also, because B[t] is not cancelled by an inverted-phase wave in the sound image space, audition positions would not be restrictive.

Also, in the effector 1 according to an embodiment of the present invention, leakage sound (B[t]) can be extracted from IN_P[t]. Therefore, this makes it possible for the user to hear which sounds are removed from IN_P[t], and thus, user-perceptible information for properly extracting P[t] can be provided.

A further embodiment of the invention is described with reference to FIGS. 7 through 12. In the embodiment described above, the effector 1 is capable of extracting leakage-removed sound in which leakage sound is removed from recorded sound of a track that records performance sound of one musical instrument as the main sound. An effector 1 in accordance with a further embodiment (as in FIG. 7) is capable of removing reverberant sound from sound collected by a single sound collecting device (for example, a microphone). Portions of the further embodiment that are identical with those of the above-described embodiment will be designated with the same reference numbers, and reference is made to the above descriptions such that further description of those portions will be omitted.

Figure 7:
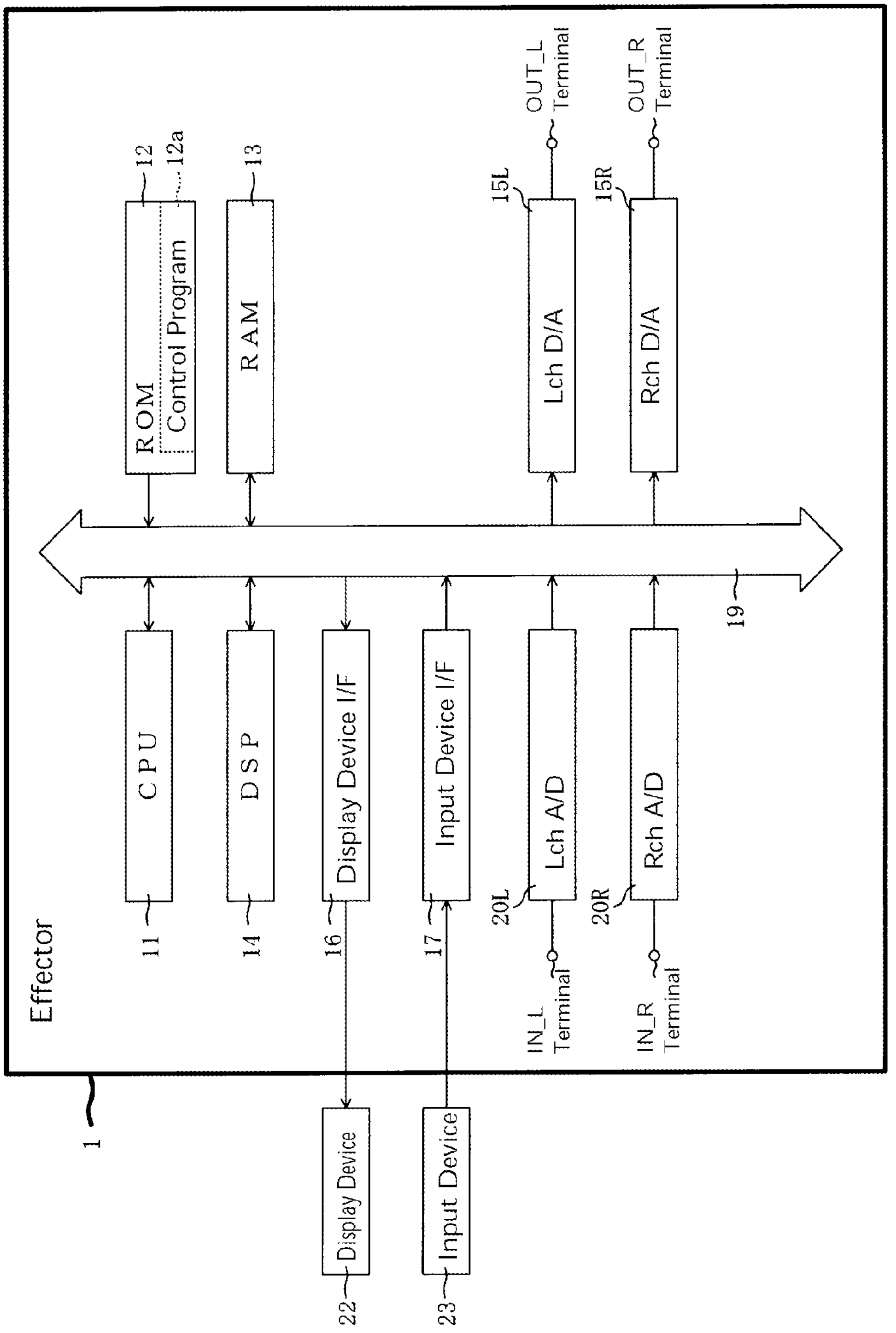
FIG. 7 is a block diagram showing a composition of an effector in accordance with a second embodiment of the invention.

FIG. 7 is a block diagram showing the configuration of the effector 1 in accordance with the further embodiment. The effector 1 in accordance with the further embodiment includes a CPU 11, a ROM 12, a RAM 13, a DSP 14, an A/D for Lch 20L, an A/D for Rch 20R, a D/A for Lch 15L, a D/A for Rch 15R, a display device I/F 16, an input device I/F 17, and a bus line 19. The "A/D" is an analog to digital converter. The components 11-14, 15L, 15R, 16, 17, 20L and 20R are electrically connected with one another through the bus line 19.

In the effector 1 in accordance with the further embodiment, a control program 12*a* stored in the ROM 12 includes a control program for each process to be executed by the DSP 14 described below with reference to FIGS. 8-10. The Lch A/D 20L is a converter that converts left-channel signals inputted from an IN_L terminal from analog signals to digital signals. The Rch A/D 20R is a converter that converts right-channel signals inputted from an IN_R terminal from analog signals to digital signals.

Figure 8:
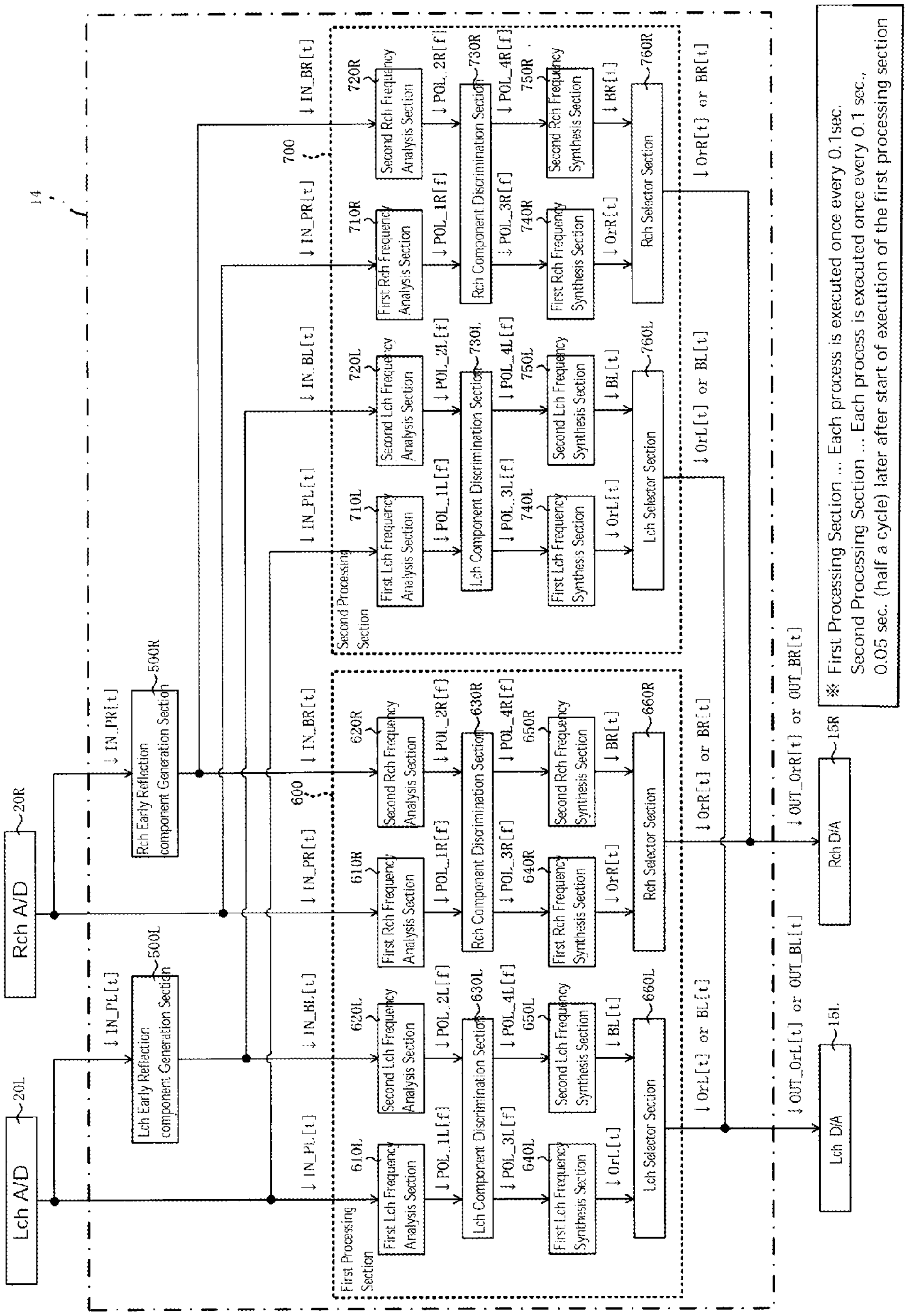
FIG. 8 is a functional block diagram showing functions of a DSP in accordance with the second embodiment.

Referring to FIG. 8, functions of the DSP 14 in the effector in accordance with the further embodiment will be described. FIG. 8 is a functional block diagram showing functions of the DSP 14 in accordance with the further embodiment. Left and right channel signals are inputted in the DSP 14 from one sound collecting device (for example, a microphone) through the Lch A/D 20L and the Rch A/D 20R. The DSP 14 discriminates signals of the original sound from signals of reverberant sound generated by sound reflection in the sound field space from the left and right channel signals inputted. Further, the DSP 14 extracts either the signal of the original sound or the signal of the reverberant sound selected, and outputs the same to the Lch D/A 15L and the Rch D/A 15R.

The functional blocks formed in the DSP 14 include an Lch early reflection component generation section 500L, an Rch early reflection component generation section 500R, a first processing section 600, and a second processing section 700.

The Lch early reflection component generation section 500L generates a pseudo signal of early reflection sound IN_BL[t] included in the left channel sound from an input signal IN_PL[t] inputted from the Lch A/D 20L. The Lch early reflection component generation section 500L inputs the generated IN_BL[t] to a second Lch frequency analysis section 620L of the first processing section 600, and a second Lch frequency analysis section 720L of the second processing section 700, respectively. Details of functions of the Lch early reflection component generation section 500L will be described with reference to FIG. 9 below.

The Rch early reflection component generation section 500R generates a pseudo signal of early reflection sound IN_BR[t] included in the right channel sound from an input signal IN_PR[t] inputted from the Rch A/D 20R. The Rch early reflection component generation section 500R inputs the generated IN_BR[t] to a second Rch frequency analysis section 620R of the first processing section 600, and a second Rch frequency analysis section 720R of the second processing section 700, respectively. The functions of the Rch early reflection component generation section 500R are similar to those of the Lch early reflection component generation section 500L described above. Therefore, the description, below (with reference to FIG. 9), of the functions of the Lch early reflection component generation section 500L, similarly applies for functions of the Rch early reflection component generation section 500R.

The first processing section 600 and the second processing section 700 repeatedly execute common processing at predetermined time intervals, respectively, with respect to the input signal IN_PL[t] supplied from the Lch A/D 20L and IN_BL [t] supplied from the Lch early reflection component generation section 500L. Furthermore, the first processing section 600 and the second processing section 700 repeatedly execute common processing at predetermined time intervals, respectively, with respect to the input signal IN_PR[t] supplied from the Rch A/D 20R and IN_BR [t] supplied from the Rch early reflection component generation section 500R. By these processes, signals OrL[t] and OrR[t] of the original sound in the two channels or signals BL[t] and BR[t] of reverberant sound are outputted. OrL[t] and OrR[t] or BL[t] and BR[t] outputted from each of the first processing section 600 and the second processing section 700 are mixed at each channel by cross-fading, and outputted as OUT_OrL[t] and OUT_OrR[t], or OUT_BL[t] and OUT_BR[t]. When OUT_OrL[t] and OUT_OrR[t] are outputted from the DSP 14, these signals are inputted in the Lch D/A 15L and the Rch D/A 15R, respectively. On the other hand, when OUT_BL[t] and OUT_BR[t] are outputted from the DSP 14, these signals are inputted in the Lch D/A 15L and the Rch D/A 15R, respectively.

More specifically, the first processing section 600 includes a first Lch frequency analysis section 610L, a second Lch frequency analysis section 620L, an Lch component discrimination section 630L, a first Lch frequency synthesis section 640L, a second Lch frequency synthesis section 650L, and an Lch selector section 660L. These components function to process left-channel input signals (IN_PL[t]) inputted from the Lch A/D 20L.

The first Lch frequency analysis section 610L multiplies IN_PL[t] inputted from the Lch A/D 20L with a Hann window as a window function, executes a fast Fourier transform process (FFT process) to transform it to a signal in the frequency domain, and then transforms it into a polar coordinate system. Then, the first Lch frequency analysis section 610L outputs to the Lch component discrimination section 630L, the left-channel signal POL_1L[f] in the frequency domain expressed in the polar coordinate system thus obtained by the transformation. The first Lch frequency analysis section 610L receives an input IN_PL[t] instead, and its output accordingly changes to POL_1L[f]. Details of each of the processes other than the above which are executed by the first Lch frequency analysis section 610L are substantially the same as those of the processes executed in S311-S313 in the embodiment described above.

The second Lch frequency analysis section 620L multiplies IN_BL[t] inputted from the Lch early reflection component generation section 500L with a Hann window as a window function, executes an FFT process to transform it to a signal in the frequency domain, and then transforms it into a polar coordinate system. Then, the second Lch frequency analysis section 620L outputs to the Lch component discrimination section 630L, the left-channel signal POL_2L[f] in the frequency domain expressed in the polar coordinate system thus obtained by the transformation. The second Lch frequency analysis section 620L receives IN_BL[t] instead, and its output accordingly changes to POL_2L[f]. Details of each of the processes other than the above which are executed by the second Lch frequency analysis section 620L are substantially the same as those of the processes executed in S321-S323 in the embodiment described above.

The Lch component discrimination section 630L obtains a ratio between an absolute value of the radius vector of POL_1L[f] supplied from the first Lch frequency analysis section 610L and an absolute value of the radius vector of POL_2L[f] supplied from the second Lch frequency analysis section 620L (i.e., a level ratio). The Lch component discrimination section 630L sets the left-channel signal of the original sound in the frequency domain expressed in the polar coordinate system to POL_3L[f] based on the obtained level ratio, and outputs the same to the first Lch frequency synthesis section 640L. Also, the Lch component discrimination section 630L sets the left-channel signal of the reverberant sound in the frequency domain expressed in the polar coordinate system to POL_4L[f], and outputs the same to the second Lch frequency synthesis section 650L. Details of processes executed by the Lch component discrimination section 630L will be described below with reference to FIG. 10.

The first Lch frequency synthesis section 640L transforms POL_3L[f] supplied from the Lch component discrimination section 630L from the polar coordinate system to the Cartesian coordinate system, and then transforms the same to a signal in the time domain by executing a reverse fast Fourier transform process (a reverse FFT process). Then, the first Lch frequency synthesis section 640L multiplies the signal in the time domain with the same window function (the Hann window as described in the present embodiment) as used in the first Lch frequency analysis section 610L. Furthermore, the first Lch frequency synthesis section 640L outputs the obtained left-channel signal of the original sound OrL[t] in the time domain expressed in the Cartesian coordinate system to the Lch selector section 660L. The first Lch frequency synthesis section 640L receives an input POL-3L[f] instead, and its output accordingly changes to OrL[t]. Details of each of the processes other than the above which are executed by the first Lch frequency analysis section 640L are substantially the same as those of the processes executed in S341-S343 in the embodiment described above.

The second Lch frequency synthesis section 650L transforms POL_4L[f] supplied from the Lch component discrimination section 630L from the polar coordinate system to the Cartesian coordinate system, and then transforms the same to a signal in the time domain through executing a reverse FFT process. Then, the second Lch frequency synthesis section 650L multiplies the signal in the time domain with the same window function (the Hann window in the present embodiment) as used in the second Lch frequency analysis section 620L. Then, the second Lch frequency synthesis section 650L outputs to the Lch selector section 660L, the obtained left-channel signal of the reverberant sound BL[t] in the time domain expressed in the Cartesian coordinate system. The second Lch frequency synthesis section 650L receives an input POL_4L[f] instead, and its output accordingly changes to BL[t]. Details of each of the processes other than the above which are executed by the second Lch frequency synthesis section 650L are substantially the same as those of the processes executed in S351-S353 in the embodiment described above.

The Lch selector section 660L outputs either OrL[t] supplied from the first Lch frequency synthesis section 640L or BL[t] supplied from the second Lch frequency synthesis section 650L in response to designation by the user. In other words, the Lch selector section 660L outputs either the left-channel signal of the original sound OrL[t] or the left-channel signal of the reverberant sound BL[t], according to designation by the user.

Furthermore, the first processing section 600 includes, for functions for processing right-channel signals, a first Rch frequency analysis section 610R, a second Rch frequency analysis section 620R, an Rch component discrimination section 630R, a first Rch frequency synthesis section 640R, a second Rch frequency synthesis section 650R, and a Rch selector section 660R.

The first Rch frequency analysis section 610R multiplies IN_PR[t] inputted from the Rch A/D 20R with a Hann window as a window function, executes a FFT process to transform it to a signal in the frequency domain, and then transforms it into a polar coordinate system. The first Rch frequency analysis section 610R outputs to the Rch component discrimination section 630R, the obtained right-channel signal POL_1R[f] in the frequency domain expressed in the polar coordinate system thus obtained by the transformation. The first Rch frequency analysis section 610R receives an input IN_PR[t] instead, and its output accordingly changes to POL_1R[f]. Details of each of the processes other than the above which are executed by the first Rch frequency analysis section 610R are substantially the same as those of the processes executed in S311-S313 in the embodiment described above.

The second Rch frequency analysis section 620R multiplies IN_BR[t] inputted from the Rch early reflection component generation section 500R with a Hann window as a window function, executes a FFT process to transform it to a signal in the frequency domain, and then transforms it into a polar coordinate system. The second Rch frequency analysis section 620R outputs to the Rch component discrimination section 630R, the right-channel signal POL_2R[f] in the frequency domain expressed in the polar coordinate system thus obtained by the transformation. The second Rch frequency analysis section 620R receives an input IN_BR[t] instead, and its output accordingly changes to POL_2R[f]. Details of each of the processes other than the above which are executed by the second Rch frequency analysis section 620R are substantially the same as those of the processes executed in S321-S323 in the embodiment described above.

The Rch component discrimination section 630R obtains a ratio between an absolute value of the radius vector of POL_1R[f] supplied from the first Rch frequency analysis section 610R and an absolute value of the radius vector of POL_2R[f] supplied from the second Rch frequency analysis section 620R (i.e., a level ratio). The Rch component discrimination section 630R sets the right-channel signal of the original sound in the frequency domain expressed in the polar coordinate system to POL_3R[f] based on the obtained level ratio, and outputs the same to the first Rch frequency synthesis section 640R. Also, the Rch component discrimination section 630R sets the right-channel signal of the reverberant sound in the frequency domain expressed in the polar coordinate system to POL_4R[f], and outputs the same to the second Rch frequency synthesis section 650R. The Rch component discrimination section 630R receives inputs of right-channel signals POL_1R[f] and POL-2R[f] instead, and its outputs change to right-channel signals POL_3R[f] and POL_4R[f]. Details of each of the processes other than the above which are executed by the Rch component discrimination section 630R are substantially the same as those of the processes executed by the Lch component discrimination section 630L described above, and therefore their detailed description corresponds to the description of the processes executed by the Lch component discrimination section 630L described below with reference to FIG. 10.

The first Rch frequency synthesis section 640R transforms POL_3R[f] supplied from the Rch component discrimination section 630R from the polar coordinate system to the Cartesian coordinate system, then executes a reverse FFT process, and multiplies the signal with the same window function (the Hann window in the present embodiment) as used in the first Rch frequency analysis section 610R. Furthermore, the first Rch frequency synthesis section 640R outputs to the Rch selector section 660R, the obtained right-channel signal of the original sound OrR[t] in the time domain expressed in the Cartesian coordinate system. The first Rch frequency synthesis section 640R receives an input POL-3R[f] instead, and its output accordingly changes to OrR[t]. Details of each of the processes other than the above which are executed by the first Rch frequency analysis section 640R are substantially the same as those of the processes executed in S341-S343 in the embodiment described above.

The second Rch frequency synthesis section 650R transforms POL_4R[f] supplied from the Rch component discrimination section 630R from the polar coordinate system to the Cartesian coordinate system, executes a reverse FFT process, and multiplies the signal with the same window function (the Hann window in the present embodiment) as used in the second Rch frequency analysis section 620R. Then, the second Rch frequency synthesis section 650R outputs to the Rch selector section 660R, the obtained right-channel signal of the reverberant sound BR[t] in the time domain expressed in the Cartesian coordinate system. The second Rch frequency synthesis section 650R receives an input POL-4R[f] instead, and its output accordingly changes to BR[t]. Details of each of the processes other than the above which are executed by the second Rch frequency synthesis section 650R are substantially the same as those of the processes executed in S351-S353 in the embodiment described above.

The Rch selector section 660R outputs either OrR[t] supplied from the first Rch frequency synthesis section 640R or BR[t] supplied from the second Rch frequency synthesis section 650R in response to a designation by the user. In other words, the Rch selector section 660R outputs either the right-channel signal of the original sound OrR[t] or the right-channel signal of the reverberant sound BR[t], according to the designation by the user.

In this manner, the first processing section 600 processes input signals of left and right channels (IN_PL[t] and IN_PR[t]) inputted from the Lch A/D 20L and Rch A/D 20R, and is capable of outputting left and right channel signals of the original sound (OrL[t] and OrR[t]) or left and right channel signals of the reverberant sound (BL[t] and BR[t]), as the user desires.

The second processing section 700 includes a first Lch frequency analysis section 710L, a second Lch frequency analysis section 720L, an Lch component discrimination section 730L, a first Lch frequency synthesis section 740L, a second Lch frequency synthesis section 750L, and an Lch selector section 760L. These sections function to process left-channel input signals (IN_PL[t]) inputted from the Lch A/D 20L. The sections 710L-760L function in a similar manner as the sections 610L-660L of the first processing section 600, respectively, and output the same signals.

More specifically, the first Lch frequency analysis section 710L functions like the first Lch frequency analysis section 610L, and outputs POL_1L[f]. The second Lch frequency analysis section 720L functions like the second Lch frequency analysis section 620L, and outputs POL_2L[f]. The Lch component discrimination section 730L functions like Lch component discrimination section 630L, and outputs POL_3L[f] and POL_4L[f]. The first Lch frequency synthesis section 740L functions like the first Lch frequency synthesis section 640L, and outputs OrL[t]. The second Lch frequency synthesis section 750L functions like the second Lch frequency synthesis section 650L, and outputs BL[t]. The Lch selector section 760L functions like the Lch selector section 660L, and outputs either OrL[t] or BL[t].

The second processing section 700 includes a first Rch frequency analysis section 710R, a second Rch frequency analysis section 720R, an Rch component discrimination section 730R, a first Rch frequency synthesis section 740R, a second Rch frequency synthesis section 750R, and an Rch selector section 760R. These components function to process right-channel input signals (IN_PR[t]) inputted from the Rch A/D 20R. The components 710R-760R function in a similar manner as the components 610R-660R of the first processing section 600, respectively, and output the same signals.

More specifically, the first Rch frequency analysis section 710R functions like the first Rch frequency analysis section 610R, and outputs POL_1R[f]. The second Rch frequency analysis section 720R functions like the second Rch frequency analysis section 620R, and outputs POL_2R[f]. The Rch component discrimination section 730R functions like Rch component discrimination section 630R, and outputs POL_3R[f] and POL_4R[f]. The first Rch frequency synthesis section 740R functions like the first Rch frequency synthesis section 640R, and outputs OrR[t]. The second Lch frequency synthesis section 750R functions like the second Rch frequency synthesis section 650R, and outputs BR[t]. The Rch selector section 760R functions like the Rch selector section 660R and outputs either OrR[t] or BR[t].

The execution interval of the processes executed by the first processing section 600 is the same as the execution interval of the processes executed by the second processing section 700. In the present example, the execution interval is 0.1 second. Also, the processes executed by the second processing section 700 are started a predetermined time later (half a cycle which is 0.05 seconds later in the present example embodiment) from the start of execution of the respective processes by the first processing section 600. Any suitable values may be used as the execution interval of the processes by the first processing section 600 and the second processing section 700, and the delay time from the start of execution of the processes in the first processing section 600 until the start of execution of the processes in the second processing section 700, and such values may be defined based on the sampling frequency and the number of signals of musical sounds.

Figure 9:
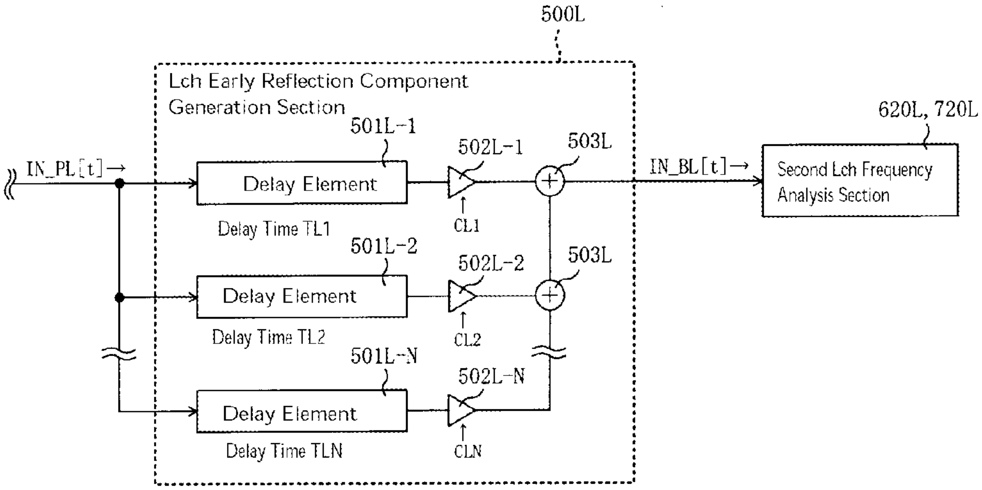
FIG. 9 (*a*) is a block diagram showing functions of an Lch early reflection component generation section.
Figure 9:
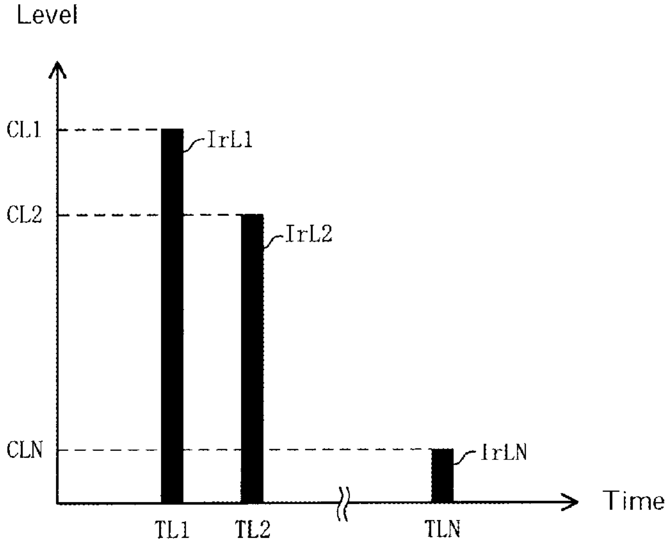

Referring to FIG. 9, functions of the Lch early reflection component generation section 500L will be described. FIG. 9(*a*) is a block diagram showing functions of the Lch early reflection component generation section 500L. The Lch early reflection component generation section 500L is a FIR filter, and configured with first through N-th delay elements 501L-1 through 501L-N, N multipliers 502L-1 through 502L-N, and an adder 503L, where N is an integer greater than 1.

The delay elements 501L-1 through 501L-N are elements that delay left-channel signals IN_PL[t] by delay times TL1-TLN respectively specified for each of the delay elements. The delay elements 501L-1 through 501L-N output signals obtained by delaying the delay times TL1-TLN to the corresponding multipliers 502L-1 through 502L-N, respectively.

The multipliers 502L-1 through 502L-N multiply the signals supplied from the corresponding delay elements 501L-1 through 501L-N by level coefficients CL1-CLN (all of them being positive numbers of 1.0 or less), respectively, and output the signals to the adders 503L. The adders 503L add all the signals outputted from the multipliers 502L-1 through 502L-N. Then, the adders 503L input a signal IN_BL[t] thus obtained to the second Lch frequency analysis section 620L of the first processing section 600 and the second Lch frequency analysis section 720L of the second processing section 700, respectively.

The number of the delay elements 501L-1 through 501L-N (i.e., N) in the Lch early reflection component generation section 500L, the delay time TL1-TLN, and the level coefficients CL1-CLN are suitably set by the user. The user operates an Lch early reflection pattern setting section 41L in an UI screen to be described below (see FIG. 12) to set these values. At least one of the delay times T1-TN may be zero (in other words, no delay is set). The number of the delay elements 501L-1 through 501L-N may be set to the number of reflection positions in a sound field space, and the delay times TL1-TLN and the level coefficients CL1-CLN may be set for the respective delay elements, whereby impulse responses IrL1-IrLN shown in FIG. 9(*b*) can be obtained. By convolution of these impulse responses IrL1-IrLN with IN-PL[t], IN_BL[t] is generated.

When there are N reflection positions, the IN_BL[t] to be generated by the Lch early reflection component generation section 500L can be expressed as $IN\_BL[t]=IN\_PL[t]\times CL1\times Z^{-m1}+IN\_PL[t]\times CL2\times Z^{-m2}+\ldots+IN\_PL[t]\times CLN\times Z^{-mN}$. It is noted that Z is a transfer function of Z-transform, and indexes of the transfer function Z (−m1, −m2, . . . −mN) are decided according to the delay times TL1-TLN, respectively.

FIG. 9(*b*) is a graph schematically showing impulse responses to be convoluted with the input signal (i.e., IN_PL [t]) in the Lch early reflection component generation section 500L shown in FIG. 9(*a*). In FIG. 9 (*b*), the horizontal axis represents time, and the vertical axis represents levels. The first impulse response IrL1 is an impulse response with the level CL1 at the delay time TL1, and the second impulse response IrL2 is an impulse response with the level CL2 at the delay time TL2. Further, the N-th impulse response IrLN is an impulse response with the level CLN at the delay time TLN.

Each of the impulse responses IrL1, IrL2, . . . , and IrLN reflects the reverberation characteristic Gb[t] of the sound field space. A left-channel signal IN_PL[t] of sound (in other words, sound inputted from the Lch A/D 20L) collected by a sound collecting device such as a microphone is generally made up of a signal of mixed sounds composed of a left-channel signal (OrL[t]) of the original sound and a signal of reverberant sound. The signal of reverberant sound is a signal in which the left-channel signal OrL[t] of the original sound is modified by the reverberation characteristic Gb[t] of the sound field space. In other words, IN_PL[t]=OrL[t]+Gb [OrL [t]]. As described above, the impulse responses IrL1-IrLN can be obtained by setting the number N of the delay elements, the delay times TL1-TLN, and the level coefficients CL1-CLN, using the UI screen 40. Therefore, by suitably setting these impulse responses IrL1-IrLN, and by convoluting them with the left-channel signal IN_PL[t], IN_BL[t] that suitably simulates left-channel reverberant sound components (Gb [OrL[t]]) can be generated from IN_PL[t] and outputted.

On the other hand, although not illustrated, the Rch early reflection component generation section 500R is also configured as an FIR filter, similar to the Lch early reflection component generation section 500L described above. A right-channel signal IN_PR[t] is inputted in the Rch early reflection component generation section 500R, and an output signal IN_BR[t] is provided to the second Rch frequency analysis sections 620R and 720R.

However, in accordance with an embodiment of the invention, the number N' of the delay elements included in the Rch early reflection component generation section 500R can be set independently of the number (i.e., N) of the delay elements 501L-1-501L-N included in the Lch early reflection component generation section 500L. Also, it is configured such that delay times TR1-TRN' of the respective delay elements and level coefficients CR1-CRN' to be multiplied with the outputs from the respective delay elements in the Rch early reflection component generation section 500R can be set independently of the settings (TL1-TLN and CL1-CLN) of the Lch early reflection component generation section 500L. The numbers N' of the delay elements, the delay times TR1-TRN', and the level coefficients CR1-CRN' are suitably set by the user. The user may operate an Rch early reflection pattern setting section 41R on the UI screen 40 to be described below (see FIG. 12), to set these values.

The IN_BR[t] to be generated by the Rch early reflection component generation section 500R can be expressed as IN_BR[t]=IN_PR[t]×CR1×$Z^{-m'1}$+IN_PR[t]×CR2×$Z^{-m'2}$+ . . . +IN_PR[t]×CRN'×$Z^{-m'N'}$. It is noted that Z is a transfer function of Z-transform, and indexes of the transfer function Z (−m'1, −m'2, . . . −m'N') are decided according to the delay times TR1-TRN', respectively. By suitably setting the number N' of the delay elements, the delay times TR1-TRN', and the level coefficients CR1-CRN', IN_BR[t] that suitably simulates right-channel reverberant sound components (Gb'[OrR[t]]) can be generated from the right-channel input signal IN_PR[t].

Figure 10:
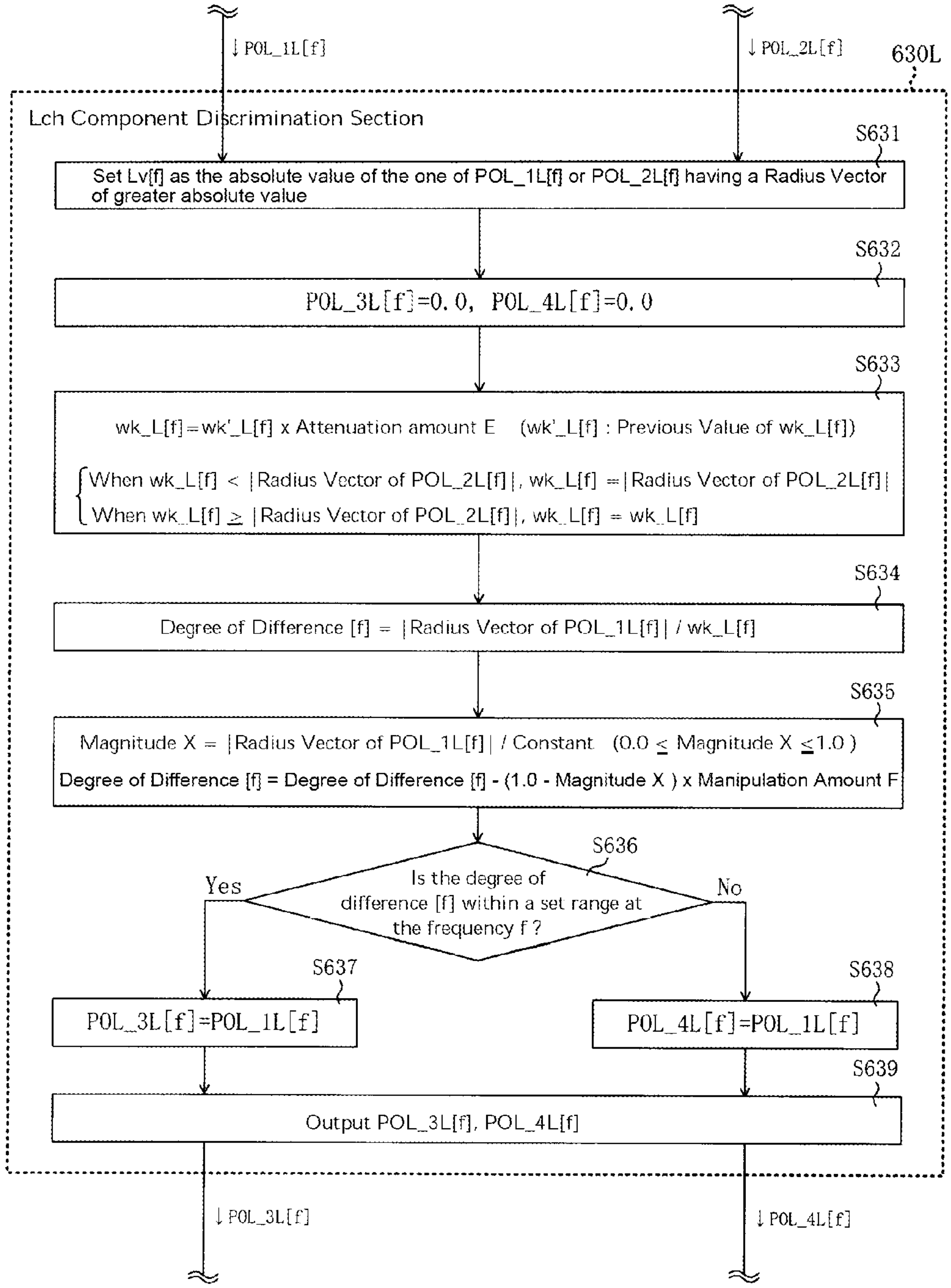
FIG. 10 is a schematic diagram with functional blocks showing a process to be executed by an Lch component discrimination section.

Referring to FIG. 10, functions of the Lch component discrimination section 630L will be described. FIG. 10 is a diagram schematically showing, with functional block diagrams, processes executed by the Lch component discrimination section 630L. Though not illustrated, the Lch component discrimination section 730L of the second processing section 700 also executes processes similar to those processes shown in FIG. 10.

First, the Lch component discrimination section 630L compares, at each frequency f, the radius vector of POL_1L [f] and the radius vector of POL_2L[f], and sets, as Lv[f], the absolute value of the radius vector with a greater absolute value (S631). Lv[f] set in S631 is supplied to the CPU 11, and is used for controlling the display of the signal display section 45 of the UI screen 40 to be described below (see FIG. 12). After the process in S631, POL_3L[f] and POL_4L[f] at each frequency f are initialized to zero (S632).

After the process in S632, a process in S633 is executed to dull attenuation of |Radius Vector of POL_2L[f]|. More specifically, in the process in S633, first, wk_L[f] is calculated at each frequency f, based on wk_L[f]=wk'_L[f]×the amount of attenuation E. It is noted that wk_L[f] is a value that is used to compare with the value of |Radius Vector of POL_1L[f]| in calculation of the degree of difference [f] in the current processing (a process in S634 to be described below), and is a value of |Radius Vector of POL_2L[f]| after correction (in other words, after having been dulled). Also, wk'_L[f] is a value that is used for calculating the degree of difference [f] in the last processing, and is a value stored in a predetermined region of the RAM 13 at the time of the previous processing. Further, the amount of attenuation E is a value set by the user on the UI screen 40 (see FIG. 12).

In other words, wk_L[f] is calculated by multiplying wk'_L [f] that is used in calculating the degree of difference [f] in the last processing by the amount of attenuation E. However, for POL_2L[f] in the initial processing, wk_L[f]=|Radius Vector of POL_2L[f]|.

Next, wk_L[f] thus calculated is compared with the absolute value of the radius vector of POL_2L[f] in the current processing supplied to the Lch component discrimination section 630L (in other words, |Radius Vector of POL_2L[f]| before correction).

As a result of the comparison, if wk_L[f]<|Radius Vector of POL_2L[f]|, then wk_L[f]=|Radius Vector of POL_2L[f]|. On the other hand, if wk_L[f]≥|Radius Vector of POL_2L[f]|, then wk_L[f]=wk_L[f] or, in other words, the value obtained by wk'_L[f]×the amount of attenuation E is set as wk_L[f]. However, the value of wk_L[f] is limited to 0.0 or greater. The value of wk_L[f] set as the result of comparison is stored in a predetermined region of the RAM 13 as wk'_L[f] to be used for the next processing for POL_2L[f].

Therefore, according to the processing in S663, when the absolute value of the radius vector of the POL_2L[f] in the current processing supplied to the Lch component discrimination section 630L has been attenuated more than a predetermined amount from the value (wk'_L[f]) used in calculation of the degree of difference [f] in the last processing, then a value obtained by multiplying the value used in calculation of the degree of difference [f] in the last processing with the amount of attenuation E is adopted as wk_L[f]. On the other hand, if the attenuation from the previous processing is within a predetermined range, then the absolute value of the radius vector of POL_2L[f] actually supplied in this processing is adopted as wk_L[f]. As a result, attenuation of the level of the signal of the early reflection component (i.e., the radius vector of POL_2L[f]) is dulled, whereby the attenuation can be made gentler. As a result, reverberant sound with a relatively lower level that follows the arrival of reflected sound after sound at a great sound level can be captured. This will be described below with reference to FIG. 11.

After the processing in S633, the ratio (level ratio) of the level of POL_1L[f] with respect to the level of POL_2L[f] after correction (i.e., wk_L[t]) is calculated, at each frequency f, as the degree of difference [f] at the frequency f (S634). In other words, in S634, the degree of difference [f]=|Radius Vector of (POL_1L[f])|/wk_L[f] is calculated. In this manner, the degree of difference [f] is a value specified according to the ratio between the level of POL_1L[f] and the level of wk_L[t]. Further, the degree of difference [f] expresses the degree of difference between the input signal (IN_PL[t]) corresponding to POL_1L[t] and the input signal (IN_BL[t] that is the signal of early reflection component of IN_PL[t]) corresponding to POL_2L[f]. In S634, the degree of difference [f] is limited between 0.0 and 2.0. Also, when wk_L[f] is 0.0, the degree of difference [f]=2.0. The degree of difference [f] calculated in S634 will be used in processing in S635 and thereafter. Further, the degree of difference [f] is supplied to the CPU 11, and will be used for controlling the display of the signal display section 45 of the UI screen 40 to be described below (see FIG. 12).

In order to manipulate the degree of difference [f] obtained by the process in S634 according to the magnitude of POL_1L[f] (|Radius Vector of POL_1L[f]|), the process in S635 is executed. More specifically, in the process S635, (|Radius Vector of POL_1L[f]|) is divided, at each frequency f, by a predetermined constant (for example, 50.0), thereby calculating the magnitude X (S635). However, the value of the magnitude X is limited between 0.0 and 1.0 (in other words, 0.0≤the magnitude X≤1.0).

After calculating the magnitude X, a value obtained by multiplying (1.0—the magnitude X) with the amount of manipulation F is deducted from the degree of difference [f] obtained in the processing in S634, whereby the degree of difference [f] is manipulated. It is noted that the amount of manipulation F is a value set by the user using the UI screen 40 (see FIG. 12).

The smaller the magnitude of POL_1L[f] (in other words, (|Radius Vector of POL_1L[f]|), the greater the value of (1.0—the magnitude X) becomes. Therefore, the smaller the value of POL_1L[f], the value to be deducted from the degree of difference [f] obtained in the processing in S634 becomes greater. Therefore, the degree of difference [f] obtained by the process in S635 becomes smaller. Therefore, POL_1L[f] that is relatively small in magnitude to a certain degree can be judged as reverberant sound in judgment in the next step S636. By the process in S635, late reverberant sound can be captured.

After the processing in S635, it is judged, at each frequency f, as to whether the degree of difference [f] is within a set range at the frequency f (S636). The "set range at the frequency f" refers to a range of degrees of difference [f] set by the user, using the UI screen 40 to be described below (see FIG. 12), to define the original sound at that frequency f. Therefore, when the degree of difference [f] is within a set range at a certain frequency f, this indicates that POL_1L[f] at that frequency f is a signal of the original sound. The processes from S631 through S639 described above are repeatedly executed within the range of Fourier-transformed frequencies f.

When the judgment in S636 is affirmative (S636: Yes), POL_3L[f] is set as POL_1L[f] (S637). When the judgment in S636 is negative (S636: No), POL_4L[f] is set as POL_1L [f] (S637). Therefore, POL_3L[f] is a signal corresponding to the original sound extracted from POL_1L[f]. On the other hand, POL_4L[f] is a signal corresponding to the reverberant sound extracted from POL_1L[f].

After the process in S637 or S638, POL_3L[f] at each frequency f is outputted to the first Lch frequency synthesis section 640L. Also, POL_4L[f] at each frequency f is outputted to the second frequency synthesis section 650L (S639). At the frequency fat which the process in S637 is executed when the judgment in S636 is affirmative, POL_1L[f] is outputted as POL_3L[f] by the process in S639 to the first Lch frequency synthesis section 640L. Also, 0.0 is outputted as POL_4L[f] to the second Lch frequency synthesis section 650L. On the other hand, at the frequency fat which the processing in S638 is executed when the judgment in S636 is negative, 0.0 is outputted as POL_3L[f] by the process in S639 to the first Lch frequency synthesis section 650L. Also, POL_1L[f] is outputted as POL_4L[f] to the second Lch frequency synthesis section 650L.

When the process shown in FIG. 10 is applied to the Lch component discrimination section 730L of the second processing section 700, POL_3L[f] is outputted to the first Lch frequency synthesis section 740L, and POL_4L[f] is outputted to the second Lch frequency synthesis section 750L.

Further, though not illustrated, at the Rch component discrimination sections 630R and 730R that process right-channel signals, their input signals change to the right-channel signals POL_1R[f] and POL_2R[f]. Also, the output signals change to POL_3R[f] that is a signal corresponding to the original sound extracted from POL_1R[f] and POL_4R[f] that is a signal corresponding to the reverberant sound extracted from POL_1R[f]. Also, the output signals are outputted to the second Rch frequency synthesis section 650R (in the case of the Rch component discrimination section 630R), or to the second Rch frequency synthesis section 750R (in the case of the Rch component discrimination section 730R). Other than the above-described processes, processes similar to the processes shown in FIG. 10 are executed.

Figure 11:
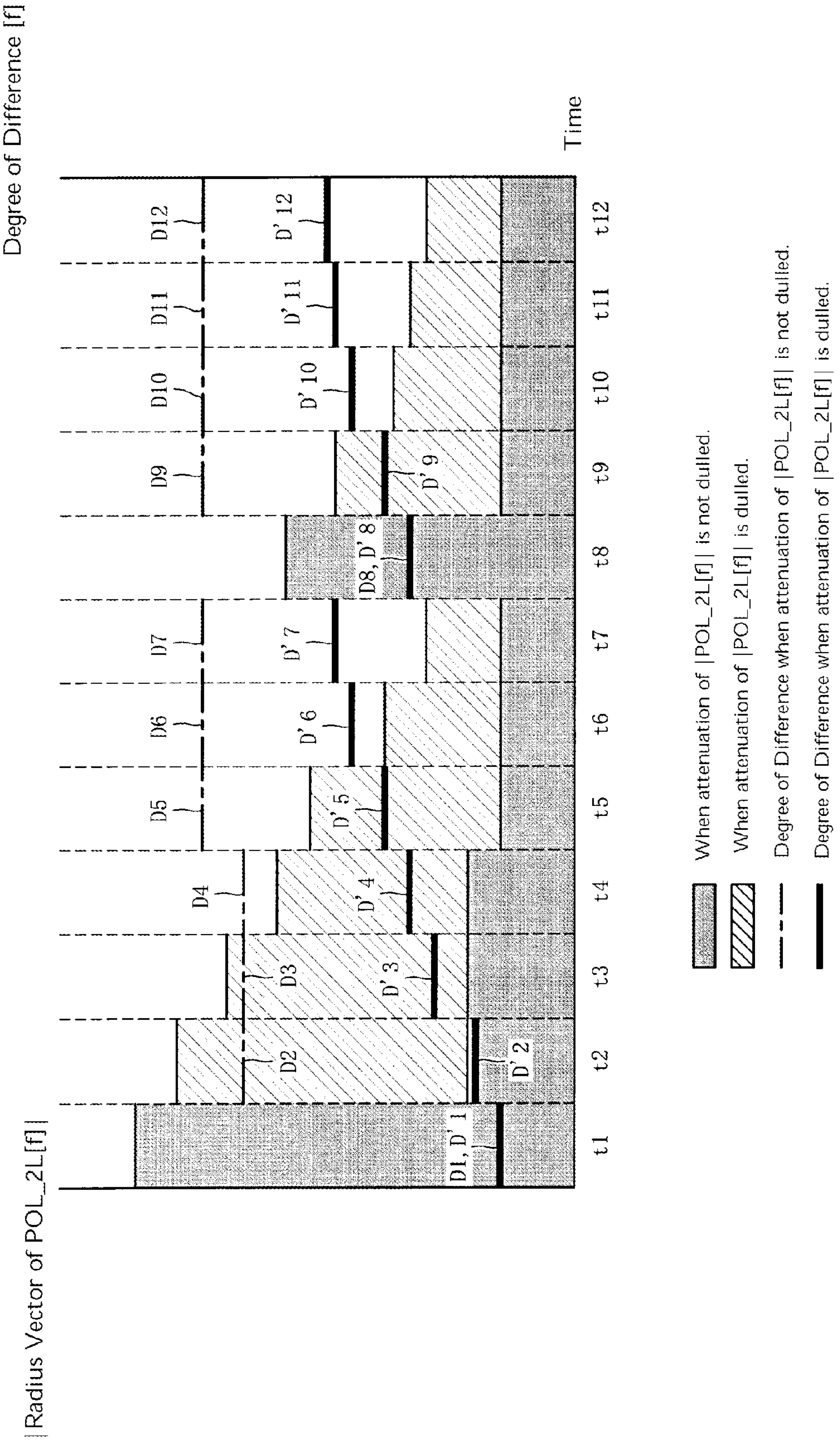
FIG. 11 is an explanatory diagram that compares an instance when attenuation of |Radius Vector of POL_2L [f]| is not dulled with an instance when |Radius Vector of POL_2L [f]| is dulled, when |Radius Vector of POL_1L[f]| is made constant at a certain frequency f.

Referring to FIG. 11, the effect of the above-described process 5633 will be described. FIG. 11 is an explanatory diagram for comparison between an instance when attenuation of |Radius Vector of POL_2L [f]| is not dulled (in other words, prior to execution of the process in S633) and an instance when |Radius Vector of POL_2L [f]| is dulled (in other words, after execution of the process in S633), when |Radius Vector of POL_1L [f] | at a frequency f is made constant. It is noted that, in FIG. 11, the description will be made using left-channel signals as an example, but the description similarly applies to right-channel signals.

In FIG. 11, the horizontal axis corresponds to time, and time advances toward the right side in the graph. The vertical axis on the left side corresponds to |Radius Vector of POL_2L [f]|, and the vertical axis on the right side corresponds to the degree of difference [f], both of which become greater toward the upper side of the vertical axis.

A bar with solid hatch (hereafter referred to as a "solid bar") represents a radius vector by means of its height in the vertical axis direction when attenuation of |Radius Vector of POL_2L[f]| is not dulled. On the other hand, a bar hatched with diagonal lines (hereafter referred to as a "cross-hatched bar") represents a radius vector by means of its height in the vertical axis direction when attenuation of |Radius Vector of POL_2L[f]| is dulled by executing the process in S633.

At time t1 and time t8, values of |Radius Vector of POL_2L [f]| are equal before and after the process S633, and therefore the solid bars and the cross-hatched bars are in the same height and therefore overlap each other. Therefore, at time t1 and time t8, no cross-hatched bars are displayed. In other words, at time t1, an initial POL_2L[f] is presented and, at time t8, it is indicated that attenuation from the last radius vector is within a predetermined range.

On the other hand, at time t2-t7, the cross-hatched bars are higher than the solid bars. In other words, at time t2-t7, attenuation from the last radius vector is greater than the predetermined amount, such that the value is corrected to a value obtained by multiplying wk'_L[f] with the amount of attenuation E, whereby the attenuation of |Radius Vector of POL_2L[f]| is made gentler.

Also, dot-and-dash lines D1-D12 drawn across times t1-t12 each indicate the degree of difference [f] that is calculated when attenuation of |Radius Vector of POL_2L[f]| is not dulled. It is noted that D1 and D8 overlap thick lines D'1 and D'8, respectively. Thick lines D'1-D'12 each indicate the degree of difference [f] that is calculated when attenuation of |Radius Vector of POL_2L[f]| is dulled.

For example, when reflected sound arrives at t1 after sound at a great sound level, the height of the solid bar at time t2 rapidly decreases as compared to the height of the solid bar at time t1. Accompanying this change, the degree of difference [f] rapidly increases from the dot-and-dash line D1 to the dot-and-dash line D2. Due to the rapid increase in the degree of difference [f], there is a possibility that the signal may be judged in S636 as a signal of the original sound, and therefore reverberant sound at a relatively lower level that follows the arrival of reflected sound after sound at a great sound level may not be captured.

In contrast, according to the effector 1 in accordance with an embodiment of the present invention, attenuation of |Radius Vector of POL_2L[f]| is dulled (in other words, the attenuation is made gentler), a rapid increase in the degree of difference [f] like the change described above can be suppressed. Therefore, it is possible to capture reverberant sound with a relatively lower level that follows after the arrival of reflected sound after sound with great sound level.

Figure 12:
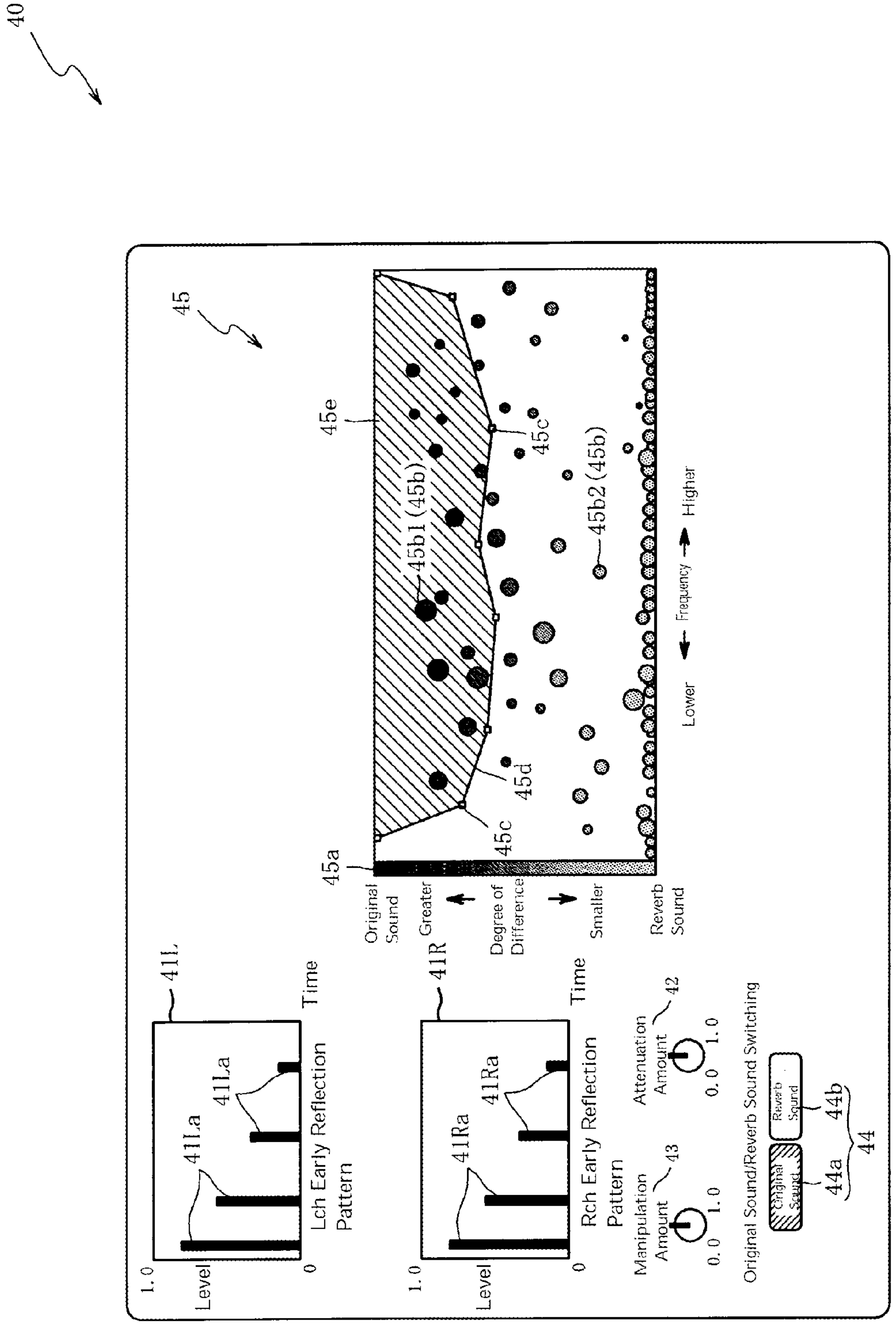
FIG. 12 is a schematic diagram showing an example of a user interface screen displayed on a display screen of a display device.

FIG. 12 is a schematic diagram showing an example of a UI screen 40 displayed on the display screen of the display device 22. The UI screen 40 includes a Lch early reflection pattern setting section 41L, a Rch early reflection pattern setting section 41R, an attenuation amount setting section 42, a manipulation amount setting section 43, a switch button 44 and a signal display section 45.

The Lch early reflection pattern setting section 41L is a screen to set parameters for generating pseudo left-channel signals of early reflection sound (IN_BL[t]) from input signals (IN_PL[t]) at the Lch early reflection component generation section 500L. The Lch early reflection pattern setting section 41L is arranged such that the horizontal axis corresponds to time and the vertical axis corresponds to the level. The Lch early reflection pattern setting section 41L displays bars 41La that are set by the user through operating the input device 23.

The number of the bars 41La corresponds to the number N of reflection positions of the left-channel signals in a sound field space. It is noted that, in the example shown in FIG. 12, four bars 41La are displayed, as "4" is set as N. The position of each of the bars 41La in the horizontal axis direction and the height thereof in the vertical axis direction correspond to a delay time TLx and a level coefficient CLx (x=any one of 1 through N in both cases), respectively. The number of the bars 41La, their positions in the horizontal axis direction and the heights in the vertical axis direction can be set by predetermined operations with the input device 23, like the bars 34*a* in the embodiment described above.

The Rch early reflection pattern setting section 41R is a screen to set parameters for generating pseudo right-channel signals of early reflection sound (IN_BR[t]) from input signals (IN_PR[t]) at the Rch early reflection component generation section 500R. The Rch early reflection pattern setting section 41R is arranged such that the horizontal axis corresponds to the time and the vertical axis corresponds to the level. The Rch early reflection pattern setting section 41R displays bars 41Ra that are set by the user by operating the input device 23.

The number of the bars 41Ra corresponds to the number N' of reflection positions of the right-channel signals in a sound field space. In the example shown in FIG. 12, four bars 41Ra are displayed, as "4" is set as N'. The position of each of the bars 41Ra in the horizontal axis direction and the height thereof in the vertical axis direction correspond to a delay time TRx and a level coefficient CRx (x=any one of 1 through N' in both cases), respectively. The number of the bars 41Ra, their positions in the horizontal axis direction and the heights in the vertical axis direction can be set by predetermined operations with the input device 23, like the bars 34*a* in the embodiment described above.

The attenuation amount setting section 42 is an operation device for setting the amount of attenuation E to be used, at the Lch component discrimination sections 630L and 730L and the Rch component discrimination sections 630R and 730R, to dull attenuation of |Radius Vector of POL_2L[f]| or to dull attenuation of Radius Vector of POL_2R[f]|. The attenuation amount setting section 42 can set the amount of attenuation E in the range between 0.0 and 1.0. The attenuation amount setting section 42 can be operated by the user through the use of the input device 23 (for example, a mouse). For example, when the input device 23 is a mouse, by placing the cursor on the attenuation amount setting section 42, and moving the mouse upward while depressing the left button on the mouse, the amount of attenuation E increases, and by moving the mouse downward, the amount of attenuation E decreases.

The manipulation amount setting section 43 is an operation device for setting the amount of manipulation F to be used, at the Lch component discrimination sections 630L and 730L and the Rch component discrimination sections 630R and 730R, to manipulate values of the degree of difference [f] according to the magnitude of POL_1L[f] or POL_1R[f]. The manipulation amount setting section 43 can set the amount of manipulation F in the range between 0.0 and 1.0. The manipulation amount setting section 43 can be operated by the user through the use of the input device 23 (for example, a mouse). For example, when the input device 23 is a mouse, by placing the cursor on the manipulation amount setting section 43, and moving the mouse upward while depressing the left button on the mouse, the amount of manipulation F increases, and by moving the mouse downward, the amount of manipulation F decreases.

The switch button 44 is a button device to designate signals outputted from the Lch selector sections 660L and 760L and the Rch selector sections 660R and 760R as signals of original sound (OrL[t] and OrR[t]) or as signals of reverberant sound (BL[t] and BR[t]). The switch button 44 includes a button 44*a* for designating the signals of original sound (OrL[t] and OrR[t]) as signals to be outputted, and a button 44*b* for designating the signals of reverberant sound (BL[t] and BR[t]) as signals to be outputted.

The switching button 44 may be operated by the user, using the input device 23 (for example, a mouse). When the button 44*a* or the button 44*b* is operated (for example, clicked), the clicked button is placed in a selected state. As a result, signals corresponding to the button are designated as signals to be outputted from the Lch selector sections 660L and 760L, and the Rch selector sections 660R and 760R. In the example shown in FIG. 12, the button 44*a* is in the selected state (is in a color, tone, highlight or other user-detectable state indicating that the button is selected). On the other hand, the button 44*b* is in a non-selected state (in a color, tone, highlight or other user-detectable state indicating that the button is not selected). In other words, as the signals to be outputted from the Lch selector sections 660L and 760L and the Rch selector sections 660R and 760R, the signals of the original sound (OrL[t] and OrR[t]) are designated (selected).

The signal display section 45 is a screen for visualizing input signals to the effector 1 (in other words, signals inputted from a sound collecting device such as a microphone through the Lch A/F 20L and the Rch A/D 20L) on a plane of the frequency f versus the degree of difference [f]. The horizontal axis of the signal display section 45 represents the frequency f, which becomes higher toward the right, and lower toward the left. On the other hand, the vertical axis represents the degree of difference [f], which becomes greater toward the top, and smaller toward the bottom. The vertical axis is appended with a color bar 45*a* that is colored with different gradations according to the magnitude of the degree of difference [f], like the color bar 36*a* of the UI screen 30 (see FIG. 6).

The signal display section 45 displays circles 45*b* each having its center at a point defined according to the frequency f and the degree of difference [f] of each input signal. The coordinates of these points (the frequency f and the degree of difference [f]) are calculated by the CPU 11 based on values calculated in the process 5634 by the Lch component discrimination section 630. The circles 45*b* are colored with colors in the color bar 45*a* respectively corresponding to the degrees of difference [f] indicated by the coordinates of the centers of the circles. Also, the radius of each of the circles 45*b* represents Lv[f] of an input signal of the frequency f, and the radius becomes greater as Lv[f] becomes greater. It is noted that Lv[f] represents values calculated, for example, in the process in S634 by the Lch component discrimination section 630L.

A plurality of designated points 45*c* displayed in the signal display section 45 are points that specify the range of settings used, for example, for the judgment in S636 by the Lch component discrimination section 630. A boundary line 45*d* is a linear line connecting adjacent ones of the designated points 45*c*, and a line that specifies the boarder of the setting range. An area 45*e* surrounded by the boundary line 45*d* and the upper edge (i.e., the maximum value of the degree of difference [f]) of the signal display section 45 defines the range of settings used for the judgment in S636.

The number of the designated points 45*c* and initial values of the respective positions are stored in advance in the ROM 12. The number of the designated points 45*c* can be increased or decreased and these points can be moved by similar operations applied to the designated points 36*c* in the embodiment described above.

Signals corresponding to circles 45*b*1 among the circles 45*b* displayed in the signal display section 45, whose centers are included inside the range 45*e* (including the boundary), are judged, for example, in S636 by the component discrimination section 630L, to be the signals whose degree of difference [f] at that frequency f are within the range of settings. On the other hand, signals corresponding to circles 45*b*2 whose centers are outside the range 45*e* are judged, for example, in S636 by the Lch component discrimination section 630L, to be the signals outside the range of settings.

Figure 13:
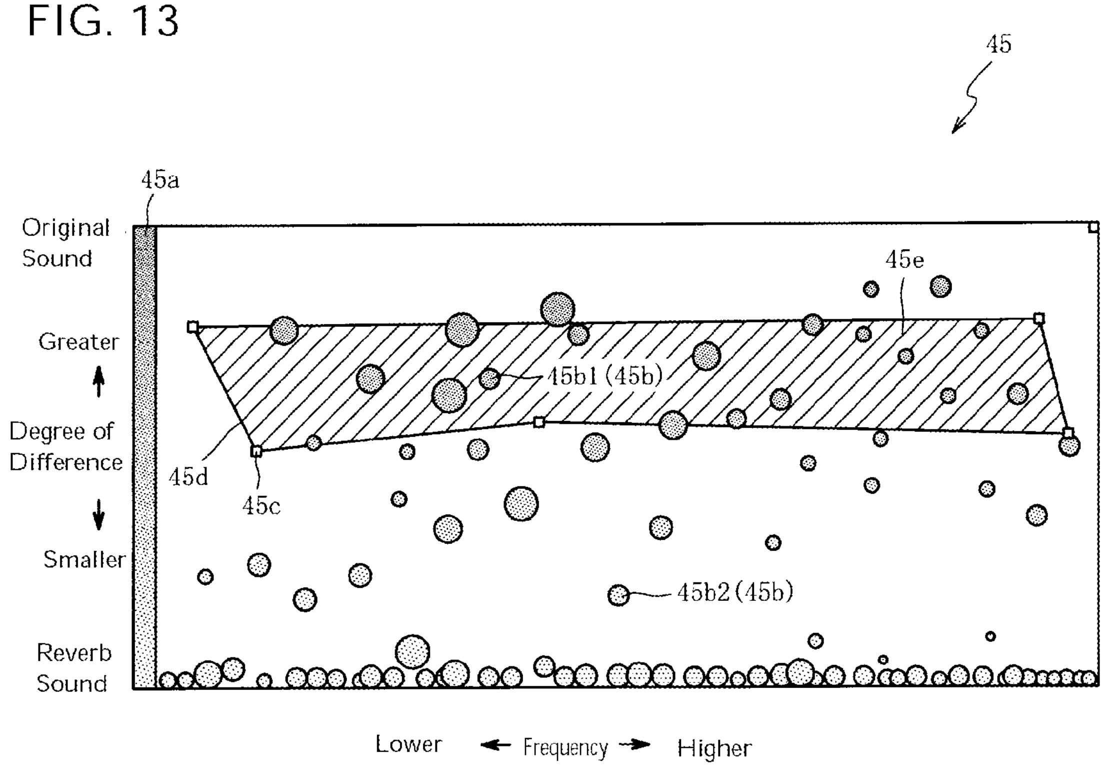
FIGS. 13 (*a*) and (*b*) are diagrams showing modified examples of the range set in a signal display section.
Figure 13:
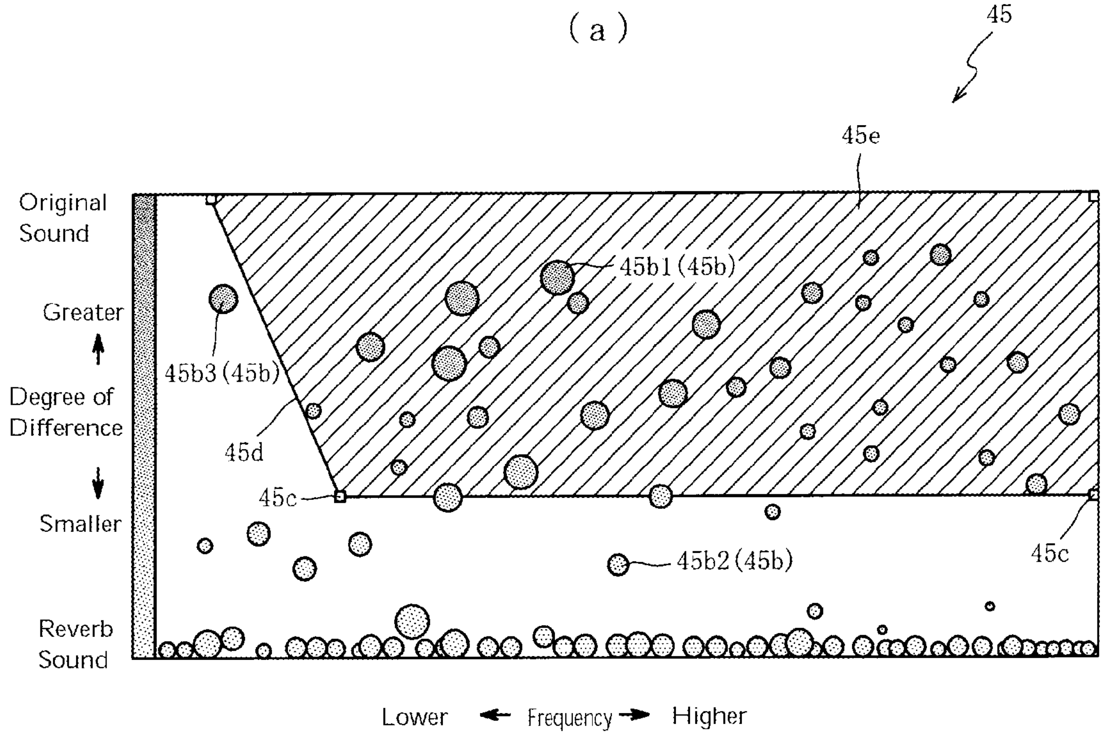

In FIG. 12, the range 45*e* is defined by the area surrounded by the boundary line 45*d* and the upper edge of the signal display section 45. However, at certain frequencies f, the threshold value of the degree of difference [f] on the greater side (i.e., the maximum value of the degree of difference [f]) is not limited to the upper edge of the signal display section 45. FIGS. 13(*a*) and (*b*) are graphs showing modified examples of the range 45*e* set in the signal display section 45. For example, as shown in FIG. 13(*a*), according to the modified example, an area surrounded by a closed boundary line 45*d* may be set as the range 45*e*.

Also, as shown in FIG. 13(*b*), the range 45*e* may be set such that circles 45*b* with a large degree of difference in a lower frequency region, for example, a circle 45*b*3, are placed outside the range. By setting the designated points 45*c* and the boundary line 45*d* such that the circle 45*b*3 with a large degree of difference in a low frequency region is placed outside the range, popping noise (noise that occurs when breathing air is blown into a microphone) can be removed.

As described above, according to the effector 1 in accordance with the second embodiment, by delaying input signals, early reflection components in reverberant sound included in the input signals can be pseudo-generated. The higher the level ratio, at each frequency f, between signals that are respectively obtained by frequency analysis of the pseudo signals of early reflection components and the input signals, the more the signal components that are not included in the pseudo signals of early reflection components (in other words, the more the signals of the original sound included in the input signals). The pseudo signals of early reflection components are, for example, IN_BL[t], the input signals are, for example, IN_PL[t], and the signals of the original sound included in IN_PL[t] are OrL[t]. In this case, the level ratio at each frequency f can be expressed as |Radius Vector of POL_1L[f]|/|Radius Vector of POL_2L[f]|. Therefore, the level ratios can be used as indexes for discriminating signals of the original sound included in the input signals from signals of the reverberant sound. Therefore, according to the level ratios, signals of the original sound or signals of the reverberant sound can be discriminated from one another and extracted from the input signals.

Extraction of the signals of the original sound or the signals of the reverberant sound is performed, focusing on the frequency characteristic and the level ratio, and does not accompany deduction of waveforms pseudo-generated on the time axis. Therefore the extraction can be readily accomplished, and sounds can be extracted with good sound quality. Also, because there is no need to cancel reverberant sound by inverted-phase waves in the sound image space, audition positions would not be restricted.

The invention has been described based on the embodiments, but the invention need not be limited in any particular manner to the embodiments described above, and it can be readily understood that many changes and improvements can be made without departing from the subject matter of the invention.

For example, in accordance with an embodiment described above, IN_B[t] outputted from the multitrack reproduction section 100 is configured to be delayed by the delay section 200. However, a delay section similar to the delay section 200 may be provided between the multitrack reproduction section 100 and the first frequency analysis section 310 and between the multitrack reproduction section 100 and the first frequency analysis section 410, and IN_P[t] delayed by the delay section may be inputted in the first frequency analysis sections 310 and 410. In this manner, by delaying IN_P[t] with respect to IN_B[t], leakage sound can be extracted from IN_P[t] (in other words, leakage sound can be removed) even when IN_B[t] precedes IN_P[t]. An instance in which IN_B [t] precedes IN_P[t] occurs, for example, when a cassette tape that records performance sound is deteriorated, and time-sequentially prior performance sound (B[t]) is transferred onto performance sound recorded at a certain time (P[t]) in a portion where segments of the wound tape overlap each other.

An embodiment described above is configured such that one delay section 200 is arranged for IN_B[t] that are reproduced signals of tracks other than the track designated by the user. However, a delay section may be provided for each of the tracks, and signals may be delayed for each of the tracks (or for each of the musical instruments). For example, when vocals and other musical instruments are concurrently performed and recorded in multitracks in a live performance or the like, the musical instruments emanate sounds from the respective locations (the positions of the guitar amplifier, the keyboard amplifier, the acoustic drums and the like). Sound of each of the musical instruments is recorded on each of the tracks with zero delay time. However, the sound of each of the musical instruments reaches the vocal microphone with a certain delay time that varies according to the distance between the sound emanating position of each of the musical instruments and the vocal microphone, and recorded on the vocal track as leakage sound (unnecessary sound). In this case, a delay time is set for each of the musical instruments (for each of the tracks).

According to an embodiment described above, sound signals recorded on all of the tracks other than the track designated by the user are defined as IN_B[t]. Alternatively, sound signals recorded on some, but not all of the tracks other than the track designated by the user may be defined as IN_B[t].

An embodiment described above is configured to execute the processing on monaural input signals (IN_P[t] and IN_B [t]). However, it may be configured to execute the processing on input signals of multiple channels (for example, left and right channels) to discriminate the main sound (leakage-removed sound) from unnecessary sound (leakage sound) at each of the channels and extract the same, in a manner similar to the further embodiment described above.

In the first embodiment described above, the level coefficients 1-Sn to be used when sound is designated as leakage-removed sound are uniformly set at 1.0 in the multitrack reproduction section 100. However, level coefficients to be used when sound is designated as leakage-removed sound may be differently set for the respective track reproduction sections 101-1 through 101-*n*, according to mixing states of sounds of musical instruments. For example, when the sound level of the drums is substantially greater than the sound level of other musical instruments, the level coefficient, for the drums, to be used when sound is designated as leakage-removed sound may be set to a value less than 1.0.

According to an embodiment described above, leakage-removed sound and leakage sound are set for the unit of each of the musical instruments. However, it may be configured such that leakage-removed sound and leakage sound are set for the unit of each of the tracks. Furthermore, the types of the musical instruments may be divided into a group in which leakage-removed sound and leakage sound are set for the unit of each musical instrument and a group in which leakage-removed sound and leakage sound are set for the unit of each track.

In accordance with an embodiment described above, signals of leakage-removed sound are extracted, using the multitrack data 21*a* that is recorded data. However, according to a modified example, at least two input channels may be provided, and sound may be inputted in each of the input channels from an independent sound collecting device, respectively. In this case, signals inputted through a specified one of the input channels may be defined as IN_P[t], synthesized signals of the signals inputted through the other input channel may be defined as IN_B[t], and signals of leakage-removed sound may be extracted from IN_P[t].

In an embodiment described above, the range 36*e* is defined by an area surrounded by the boundary line 36*d* and the upper edge of the signal display section 36. However, the threshold value of the degree of difference [f] on the greater side (in other words, the maximum value of the degree of difference [f]) at a certain frequency f is not limited to the upper edge of the signal display section 36, and the range 36*e* may be defined by an area surrounded by a closed boundary line, in a manner similar to the example shown in FIG. 13(*a*).

In accordance with an embodiment described above, the multitrack data 21*a* stored in the external HDD 21 is used. However, the multitrack data 21*a* may be stored in any one of various types of media. Also, the multitrack data 21*a* may be stored in a memory such as a flash memory built in the effector 1.

In accordance with the further embodiment described above, signals inputted through the Lch A/D 20L and the Rch A/D 20R are processed to discriminate original sound and reverberant sound from one another. However, data recorded on a hard disk drive may be processed to discriminate original sound and reverberant sound from one another.

In accordance with the further embodiment described above, left-channel signals inputted through the Lch A/D 20L and right-channel signals inputted through Rch A/D 20R are processed independently from one another. However, left-channel signals inputted through the Lch A/D 20L and right-channel signals inputted through Rch A/D 20R may be mixed into monaural signals, and the monaural signals may be processed. It is noted that, in this case, a single D/A may be provided, instead of the D/As for the respective channels (i.e., the Lch D/A 15L and the Rch D/A 15R).

In accordance with the further embodiment described above, left and right signals of two channels are independently processed from one another to discriminate original sound and reverberant sound from one another. However, in the case of signals of more than two channels, signals on each of the channels may be independently processed to discriminate original sound and reverberant sound from one another. Furthermore, monaural signals may be processed to discriminate original sound and reverberant sound from one another.

In accordance with the further embodiment described above, IN_BL[t] generated by the Lch early reflection component generation section 500L is decided solely based on left-channel input signals (IN_PL[t]) and parameters (N, TL1-TLN, and CL1-CLN) set for the left-channel input signals. However, right-channel input signals (IN_PR[t]) and parameters (N', TL1-TLN', and CL1-CLN') set for the right-channel input signals may also be considered.

In other words, in accordance with the further embodiment described above, IN_BL[t]=IN_PL[t]×CL1×$Z^{-m1}$+IN_PL [t]×CL2×$Z^{-m2}$+ . . . +IN_PL[t]×CLN×$Z^{-mN}$. However, it may be configured such that IN_BL[t]=(IN_PL[t]×CL1×$Z^{-m1}$+ IN_PL[t]×CL2×$Z^{-m2}$+ . . . +IN_PL[t]×CLN×$Z^{-mN}$)+(IN_PR [t]×CR1×$Z^{-m'1}$+IN_PR[t]×CR2×$Z^{-m'2}$+ . . . +IN_PR[t]× CRN'×$Z^{-m'N'}$). Similarly, IN_BR[t] generated by Rch early reflection component generation section 500R may be configured such that IN_BR[t]=(IN_PR[t]×CR1×$Z^{-m'1}$+IN_PR [t]×CR2×$Z^{-m'2}$+ . . . +IN_PR[t]×CRN'×$Z^{-m'N'}$)+(IN_PL[t]× CL1×$Z^{-m1}$+IN_PL[t]×CL2×$Z^{-m2}$+ . . . +IN_PL[t]×CLN× $Z^{-mN}$).

In accordance with the further embodiment described above, parameters (N, TL1-TLN, CL1-CLN) to be used for generating IN_BL[t] by the Lch early reflection component generation section 500L, and parameters (N', TR1-TRN', CR1-CRN') to be used for generating IN_BR[t] by the Rch early reflection component generation section 500R are set independently from one another and used. However, they may be configured such that mutually common parameters may be set and used. In this case, the Lch early reflection pattern setting section 41L and the Rch early reflection pattern setting section 41R may be configured as a single early reflection pattern setting section in the UI screen 40.

Figure 14:
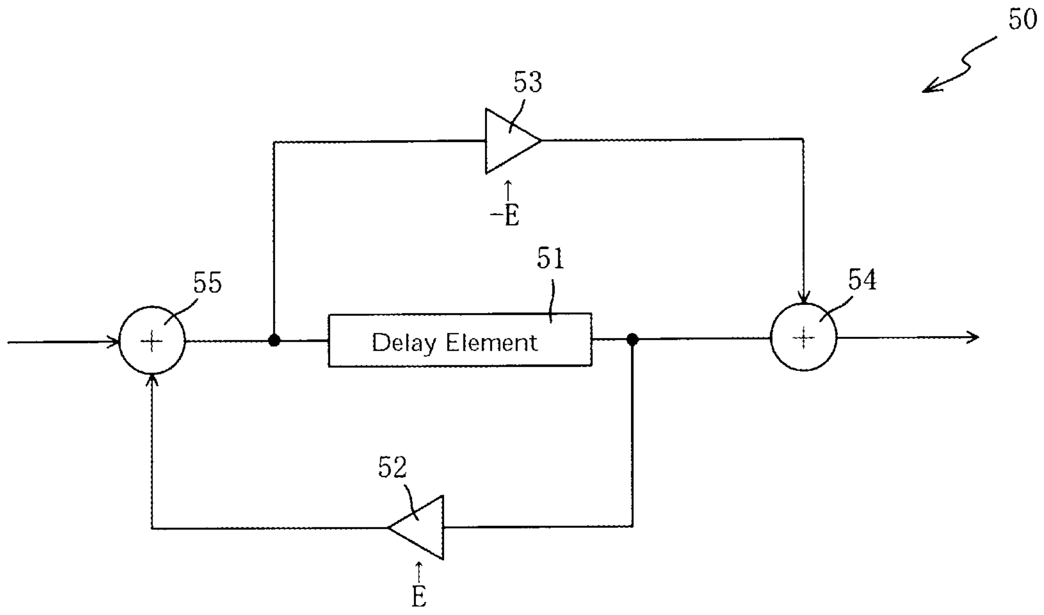
FIG. 14 is a block diagram showing a configuration of an all-pass filter.

In accordance with the further embodiment described above, the early reflection component generation sections 500L and 500R are formed from FIR filters. However, each of the delay elements 501L-1-501L-N and 501R-1-501R-N' may be replaced with an all-pass filter 50 as shown in FIG. 14. FIG. 14 is a block diagram showing an example of the composition of an all-pass filter 50.

The all-pass filter 50 is a filter that does not change the frequency characteristic of inputted sound, but changes the phase. The all-pass filter 50 is comprised of an adder 55, a multiplier 53, a delay element 51, a multiplier 52 and an adder 54. The adder 55 adds an input signal (IN_PL[t] or IN_PR[t]) and an output of the multiplier 52 and outputs the result. The multiplier 53 multiplies the output of the adder 55 with the amount of attenuation −E as a coefficient (it is noted that E is a value set by the attenuation amount setting section 42). The multiplier 52 multiplies a signal delayed by the delay element 51 with the amount of attenuation E. The adder 54 adds the output of the multiplier 53 and the output of the delay element 51 and outputs the result. When the all-pass filter 50 is used, the process of dulling attenuation of |Radius Vector of POL_2L[f]| or |Radius Vector of POL_2R[f]| (for example the process S633 described above) may be omitted.

In each of the embodiments described above, the level ratio of signals (the ratio of radius vectors of signals) is defined as the degree of difference [f]. However, the power ratio of signals may be used. In other words, in each of the embodiments described above, the degree of difference [f] is calculated using a value obtained by the square root of the sum of a value of the square of the real part of IN_P[f] or IN_B[f] and a value of the square of the imaginary part thereof (i.e, the signal level). However, the degree of difference [f] may be calculated using the sum of a value of the square of the real part of IN_P[f] or IN_B[f] and a value of the square of the imaginary part thereof (i.e., the signal power).

In accordance with an embodiment described above, the degree of difference [f] is given by |Radius Vector of POL_1[*f*]|/|Radius Vector of POL_2[*f*]|. In other words, the ratio of the level of POL_1[*f*] with respect to the level of POL_2[*f*] is calculated as the degree of difference [f]. However, the ratio of the level of POL_2[*f*] with respect to the level of POL_1[*f*] may be used as a parameter, instead of the degree of difference [f]. It is noted that the further embodiment is similarly configured.

In each of the embodiments described above, a Hann window is used as the window function. However, any one of other types of window functions, such as, but not limited to a Hamming window, a Blackman window and the like may be used.

In the embodiments described above, as the range (36*e*, 45*e*) set in the signal display section (36, 45) of the UI screen (30 and 40), a single range is set regardless of performance time segments of each piece of music. However, a plurality of ranges (36*e*, 45*e*) may be set for each piece of music. In other words, distinct ranges (36*e*, 45*e*) may be set according to the performance time segments of each piece of music. In this case, each time one range (36*e*, 45*e*) changes to another, the performing time segment and the range may be correlated with each other and stored in the RAM 13. By setting distinct ranges (36*e*, 45*e*) according to performance time segments in a single piece of music, target sound (leakage-removed sound or original sound) can be more appropriately extracted.

In the embodiments described above, the boundary line 45*d* in the signal display sections 36 and 45 is defined by a linear line connecting adjacent ones of the designated points 45*c*. However, a spline curve defined by a plurality of designated points 45*c* may be used.

In each of the embodiments described above, the signal display section (36, 45) of the UI screen (30, 40) is configured to display signals by the circles (36*b*, 45*b*). However, in other embodiments, other suitable shapes may be used, instead of a circle.

Also, each of the circles (36*b*, 45*b*) displayed in the signal display section (36, 45) is configured to represent the level of the signal by the size of the circle (the length of its radius). However, in other embodiments, they may be displayed in a three-dimensional coordinate system with an axis for the level added as the third axis.

In each of the embodiments described above, the display device 22 and the input device 23 are provided independently of the effector 1. However, the effector 1 may include a display screen and an input section as part of the effector 1. In this case, contents displayed on the display device 22 may be displayed on the display screen within the effector 1, and input information received from the input device 23 may be received at the input section of the effector 1.

In accordance with the further embodiment described above, the first processing section 600 is configured to have the Lch selector section 660L and the Rch selector section 660R, and the second processing section 700 is configured to have the Lch selector section 760L and the Rch selector section 760R (see FIG. 8). However, without providing these selector sections 660L, 660R, 760L and 760L, original sound and reverberant sound outputted from each of the processing sections 600 and 700 may be mixed by cross-fading for each of the left and right channels, D/A converted and outputted. More specifically, first, signals OrL[t] outputted from the first Lch frequency synthesis sections 640L and 740L are mixed by cross-fading and inputted in a D/A provided for left-channel original sound output. Second, signals OrR[t] outputted from the first Rch frequency synthesis sections 640R and 740R are mixed by cross-fading and inputted in a D/A provided for right-channel original sound output. Third, signals BL[t] outputted from the second Lch frequency synthesis sections 650L and 750L are mixed by cross-fading and inputted in a D/A provided for left-channel reverberant sound output. Fourth, signals BR[t] outputted from the second Rch frequency synthesis sections 650R and 750R are mixed by cross-fading and inputted in a D/A provided for right-channel reverberant sound output. In this case, for example, the original sound on the left and right channels are outputted from stereo speakers disposed in the front, and the reverberant sound on the left and right channels are outputted from stereo speakers disposed in the rear, whereby music and sound effects are recreated well.

In an embodiment described above, frequency-synthesis is performed by each of the frequency synthesis sections 340, 350, 440 and 450, and then signals in the time domain of leakage-removed sound or signals in the time domain of leakage sound are selected by the selector sections 360 and 460 and outputted. However, after selecting either POL_3[*f*] or POL_4[*f*] by a selector, the selected signals may be frequency-synthesized and converted into signals in the time domain. Similarly, in the further embodiment described above, a set of POL_3L[f] and POL_3R[f] or a set of POL_4L[f] and POL_4R[f] may be selected by a selector, and the selected signals may be frequency-synthesized and converted into signals in the time domain.

What is claimed is:

1. A sound signal processing device comprising:

a dividing device that divides each of two signals that have temporal relation in their entirety or in part, into a plurality of frequency bands, one of the two signals being a mixed sound signal and the other of the two signals being a target sound signal, the mixed sound signal being a signal in the time domain of mixed sound including first sound and second sound, and the target sound signal being a signal in the time domain of sound including sound corresponding to at least the second sound;

a level ratio calculating device that calculates a level ratio of the two signals for each frequency band of the plurality of frequency bands;

a judging device that judges whether or not the level ratio calculated by the level ratio calculating device for each frequency band is within a pre-set range, where the pre-set range of level ratios for each frequency band corresponds to the first sound;

an extracting device that extracts, from the mixed sound signal, a signal in each frequency band having the level ratio that is judged by the judging device to be in the pre-set range;

an output signal generation device that converts the signal extracted by the extracting device to a signal in the time domain as an output signal;

an output device that outputs the output signal in the time domain;

a first input device that inputs a signal in the time domain of mixed sound including first sound outputted from a first output source and second sound outputted from at least one second output source, as the mixed sound signal;

a second input device that inputs a signal in the time domain of the second sound outputted from the at least one second output source, as the target sound signal; and an adjusting device that provides an adjusted signal by delaying one of the mixed sound signal and the target sound signal on a time axis by an adjustment amount according to a time difference between a signal of the second sound in the mixed sound signal and a signal of the second sound in the target sound signal;

wherein the dividing device divides the adjusted signal obtained by the adjusting device and an original signal from among the mixed sound signal or the target sound signal which is not adjusted by the adjusting device, into a plurality of frequency bands, respectively; and wherein the adjusting device provides the adjusted signal by using, as adjustment amounts, a number of delay times corresponding to the number of the second output sources, where each delay time is a time for adjusting the time difference generated according to a characteristic of a sound field space between each of the second output sources to a sound collecting device that collects the mixed sound, adjusting the mixed sound signal or the target sound signal on the time axis for each of the adjustment amounts, multiplying the mixed sound signal or the target sound signal adjusted by a coefficient set for each of the adjustment amounts to obtain adjusted signals, and adding the adjusted signals together.

2. A sound signal processing device according to claim 1, further comprising:

a second extracting device that extracts a signal from signals corresponding to the mixed sound signal among the adjusted signal or the original signal in a frequency band, with the level ratio that is judged by the judging device as being outside of the pre-set range;

a second output signal generation device that converts the signal extracted by the second extraction device to a signal in the time domain, to provide an output signal; and a second output device that outputs the output signal provided by the second output signal generation device.

3. A sound signal processing device according to claim 2, further comprising:

a reproducing device that reproduces, in multiple tracks, signals of sounds recorded on a plurality of tracks;

wherein the first input device inputs a signal on a track that mainly records the signal of the first sound among the signals on the plurality of tracks reproduced by the reproducing device; and the second input device inputs a signal in at least one other of the tracks that records the signal of the second sound, the at least one other track being a track other than the track that mainly records the signal of the first sound among the signals in the plurality of tracks reproduced by the reproducing device.

4. A sound signal processing device according to claim 1, further comprising:

a reproducing device that reproduces, in multiple tracks, signals of sounds recorded on a plurality of tracks;

wherein the first input device inputs a signal on a track that mainly records the signal of the first sound among the signals on the plurality of tracks reproduced by the reproducing device; and the second input device inputs a signal in at least one other of the tracks that records the signal of the second sound, the at least one other track being a track other than the track that mainly records the signal of the first sound among the signals in the plurality of tracks reproduced by the reproducing device.

5. A sound signal processing device comprising:

a dividing device that divides each of two signals that have temporal relation in their entirety or in part, into a plurality of frequency bands, one of the two signals being a mixed sound signal and the other of the two signals being a target sound signal, the mixed sound signal being a signal in the time domain of mixed sound including first sound and second sound, and the target sound signal being a signal in the time domain of sound including sound corresponding to at least the second sound;

a level ratio calculating device that calculates a level ratio of the two signals for each frequency band of the plurality of frequency bands;

a judging device that judges whether or not the level ratio calculated by the level ratio calculating device for each frequency band is within a pre-set range, where the pre-set range of level ratios for each frequency band corresponds to the first sound;

an extracting device that extracts, from the mixed sound signal, a signal in each frequency band having the level ratio that is judged by the judging device to be in the pre-set range;

an output signal generation device that converts the signal extracted by the extracting device to a signal in the time domain as an output signal;

an output device that outputs the output signal in the time domain;

an input device that inputs, as the mixed sound signal, a signal in the time domain of mixed sound including first sound outputted from a predetermined output source and second sound generated based on the first sound in a sound field space, the first and second sounds being collected by a single sound collecting device; and a pseudo signal generation device that delays, on the time axis, the signal of the mixed sound inputted from the input device according to an adjustment amount, the adjustment amount determined according to a time difference between a timing at which the first sound outputted from the predetermined output source is collected by the sound collecting device, and a timing at which the second sound generated based on the first sound is collected by the sound collecting device, to generate a pseudo signal of the second sound as the target sound signal from the signal of the mixed sound;

wherein the dividing device divides each of the mixed sound signal and the pseudo signal of the second sound that is generated as the target sound signal, into a plurality of frequency bands;

wherein:

the mixed sound is obtained by collecting, in a single sound collecting device, the first sound outputted from the predetermined output source and reverberation sound as the second sound generated based on the first sound in a sound field space;

the pseudo signal generation device delays the mixed sound signal on the time axis according to the adjustment amount, to provide a signal of early reflection sound in the reverberation sound as the pseudo signal of the second sound;

the judging device judges, at each of the frequency bands, as to whether or not the level ratio calculated by the level ratio calculation device for the frequency band is within the pre-set range of level ratios representing the first sound; and the adjusting device provides the pseudo signal of the second sound by using, as adjustment amounts, a number of delay times corresponding to a number set for reflection positions that reflect the first sound in the sound field space, where each of the delay times is a delay time generated according to the reverberation characteristic in a sound field space, as a delay time from the time when the first sound is collected by the sound collection device to the time when reverberation sound generated based on the first sound is collected by the sound collection device, adjusting the mixed sound signal on the time axis for each of the adjustment amounts, multiplying the adjusted mixed sound signal by a coefficient set for each of the adjustment amounts to obtain adjusted signals, and adding the adjusted signals together.

6. A sound signal processing device according to claim 5, further comprising a level correction device that compares a present level of the pseudo signal of the second sound with a previous level thereof and, corrects the level of the pseudo signal of the second sound to be used by the level ratio calculation device to a level obtained by multiplying the previous level with a predetermined attenuation coefficient, when the present level is smaller than a level obtained by multiplying the previous level with the predetermined attenuation coefficient.

7. A sound signal processing device according to claim 6, further comprising a level ratio correction device that corrects a level ratio calculated by the level ratio calculation device such that, the smaller the level of the mixed sound signal, the smaller the ratio of the level of the mixed sound signal with respect to the level of the pseudo signal of the second sound, wherein the judging device uses the level ratio corrected by the level ratio correction device to judge as to whether or not the level ratio is within the pre-set range.

8. A sound signal processing device according to claim 5, further comprising a level ratio correction device that corrects a level ratio calculated by the level ratio calculation device such that, the smaller the level of the mixed sound signal, the smaller the ratio of the level of the mixed sound signal with respect to the level of the pseudo signal of the second sound, wherein the judging device uses the level ratio corrected by the level ratio correction device to judge as to whether or not the level ratio is within the pre-set range.

9. A sound signal processing device comprising an electronic processing device for processing electronic signals representing sound, the electronic processing device configured to:

divide each of two signals into a plurality of frequency bands, one of the two signals being a mixed sound signal and the other of the two signals being a target sound signal, the mixed sound signal including first sound and second sound, and the target sound signal including at least the second sound;

calculate a level ratio of the two signals for each frequency band of the plurality of frequency bands;

judge whether or not the calculated level ratio for each frequency band is within a pre-set range, where the pre-set range of level ratios for each frequency band corresponds to the first sound;

extract, from the mixed sound signal, a signal in each frequency band that has a level ratio that is judged to be in the pre-set range;

output the extracted signal in the time domain;

obtain, from a first input device, an input signal in the time domain of mixed sound including first sound outputted from a first output source and second sound outputted from at least one second output source, as the mixed sound signal;

obtain, from a second input device, an input signal in the time domain of the second sound outputted from the at least one second output source, as the target sound signal; and provide an adjusted signal by delaying one of the mixed sound signal and the target sound signal on a time axis by an adjustment amount according to a time difference between a signal of the second sound in the mixed sound signal and a signal of the second sound in the target sound signal;

divide the adjusted signal and an original signal from among the mixed sound signal or the target sound signal which is not adjusted, into a plurality of frequency bands, respectively; and provide the adjusted signal by using, as adjustment amounts, a number of delay times corresponding to the number of the second output sources, where each delay time is a time for adjusting the time difference generated according to a characteristic of a sound field space between each of the second output sources to a sound collecting device that collects the mixed sound, adjusting the mixed sound signal or the target sound signal on the time axis for each of the adjustment amounts, multiplying the mixed sound signal or the target sound signal adjusted by a coefficient set for each of the adjustment amounts to obtain adjusted signals, and adding the adjusted signals together.

10. A method for processing sound signals, the method comprising:

dividing each of two signals into a plurality of frequency bands, one of the two signals being a mixed sound signal and the other of the two signals being a target sound signal, the mixed sound signal including first sound and second sound, and the target sound signal including at least the second sound;

calculating a level ratio of the two signals for each frequency band of the plurality of frequency bands;

judging whether or not the calculated level ratio for each frequency band is within a pre-set range, where the pre-set range of level ratios for each frequency band corresponds to the first sound;

extracting, from the mixed sound signal, a signal in each frequency band that has a level ratio that is judged to be in the pre-set range;

outputting the extracted signal in the time domain;

obtaining, from a first input device, an input signal in the time domain of mixed sound including first sound outputted from a first output source and second sound outputted from at least one second output source, as the mixed sound signal;

obtaining, from a second input device, an input signal in the time domain of the second sound outputted from the at least one second output source, as the target sound signal; and providing an adjusted signal by delaying one of the mixed sound signal and the target sound signal on a time axis by an adjustment amount according to a time difference between a signal of the second sound in the mixed sound signal and a signal of the second sound in the target sound signal;

dividing the adjusted signal and an original signal from among the mixed sound signal or the target sound signal which is not adjusted, into a plurality of frequency bands, respectively; and providing the adjusted signal by using, as adjustment amounts, a number of delay times corresponding to the number of the second output sources, where each delay time is a time for adjusting the time difference generated according to a characteristic of a sound field space between each of the second output sources to a sound collecting device that collects the mixed sound, adjusting the mixed sound signal or the target sound signal on the time axis for each of the adjustment amounts, multiplying the mixed sound signal or the target sound signal adjusted by a coefficient set for each of the adjustment amounts to obtain adjusted signals, and adding the adjusted signals together.

* * * * *